United States Patent
Ou et al.

(10) Patent No.: US 11,665,890 B2
(45) Date of Patent: *May 30, 2023

(54) ONE-TIME PROGRAMMABLE MEMORY DEVICE INCLUDING ANTI-FUSE ELEMENT AND MANUFACTURING METHOD THEREOF

(71) Applicant: TAIWAN SEMICONDUCTOR MANUFACTURING CO., LTD., Hsinchu (TW)

(72) Inventors: Chiung-Ting Ou, Tainan (TW); Ming-Yih Wang, Hsinchu (TW); Jian-Hong Lin, Yunlin County (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 17/393,621

(22) Filed: Aug. 4, 2021

(65) Prior Publication Data

US 2021/0366918 A1 Nov. 25, 2021

Related U.S. Application Data

(63) Continuation of application No. 16/786,099, filed on Feb. 10, 2020, now Pat. No. 11,094,702.

(51) Int. Cl.
*H01L 27/112* (2006.01)
*H01L 23/48* (2006.01)

(52) U.S. Cl.
CPC ...... *H01L 27/11206* (2013.01); *H01L 23/481* (2013.01)

(58) Field of Classification Search
CPC .................. H01L 27/11206; H01L 23/481
See application file for complete search history.

(56) References Cited

U.S. PATENT DOCUMENTS

| | | | |
|---|---|---|---|
| 9,105,490 B2 | 8/2015 | Wang et al. | |
| 9,196,377 B1 * | 11/2015 | Park .................. | G11C 13/0004 |
| 9,236,267 B2 | 1/2016 | De et al. | |
| 9,236,300 B2 | 1/2016 | Liaw | |
| 9,406,804 B2 | 8/2016 | Huang et al. | |
| 9,443,769 B2 | 9/2016 | Wang et al. | |
| 9,520,482 B1 | 12/2016 | Chang et al. | |
| 9,548,366 B1 | 1/2017 | Ho et al. | |
| 9,576,814 B2 | 2/2017 | Wu et al. | |
| 9,589,971 B1 * | 3/2017 | Chang ............... | H01L 27/11206 |
| 9,831,183 B2 | 11/2017 | Lin et al. | |
| 9,859,386 B2 | 1/2018 | Ho et al. | |

(Continued)

*Primary Examiner* — Mamadou L Diallo
(74) *Attorney, Agent, or Firm* — Birch, Stewart, Kolasch & Birch, LLP

(57) ABSTRACT

A memory device includes a transistor, an anti-fuse element, a first gate via, a second gate via, and a bit line. The transistor includes a fin structure and a first gate structure across the fin structure. The anti-fuse element includes the fin structure and a second gate structure across the fin structure. The first gate via is connected to the first gate structure of the transistor and is spaced apart from the fin structure in a top view. The second gate via is connected to the second gate structure of the anti-fuse element and is directly above the fin structure. The bit line is connected to the fin structure and the transistor.

20 Claims, 38 Drawing Sheets

(56) References Cited

U.S. PATENT DOCUMENTS

| | | | |
|---|---|---|---|
| 2011/0108926 A1* | 5/2011 | Bahl | H01L 27/11206 |
| | | | 257/E27.014 |
| 2011/0233617 A1* | 9/2011 | Or-Bach | H01L 21/76254 |
| | | | 257/202 |
| 2014/0209989 A1* | 7/2014 | Kurjanowicz | G11C 17/18 |
| | | | 438/281 |
| 2018/0019248 A1* | 1/2018 | Kasai | G11C 17/16 |
| 2018/0204843 A1* | 7/2018 | Son | H01L 27/11206 |

* cited by examiner

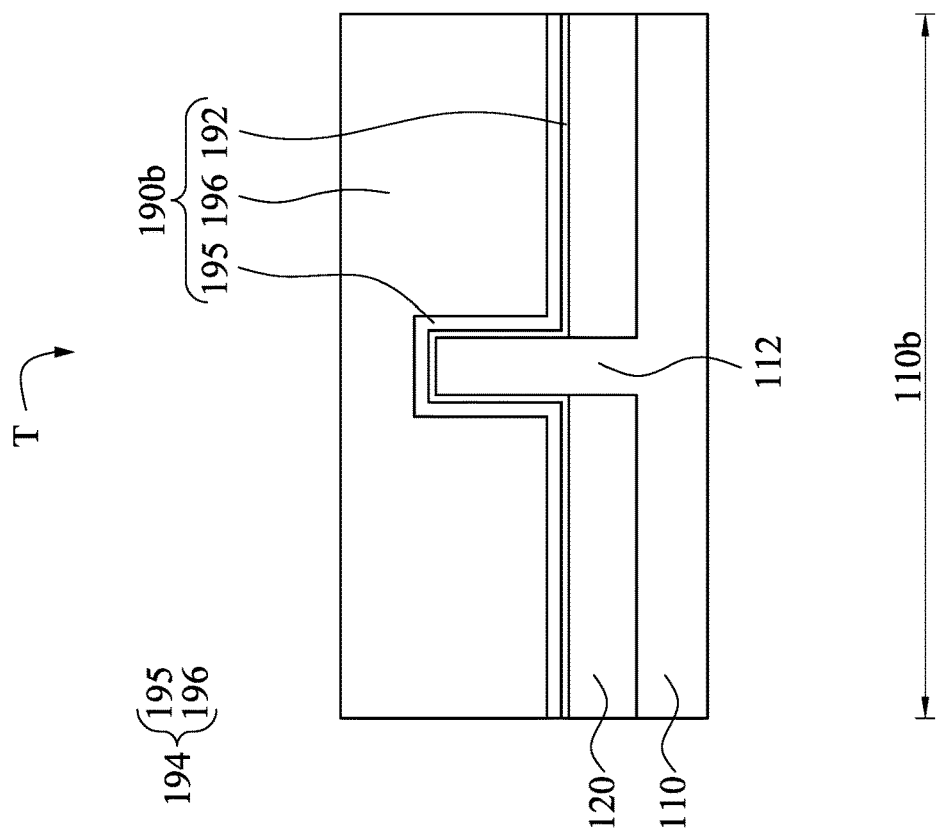
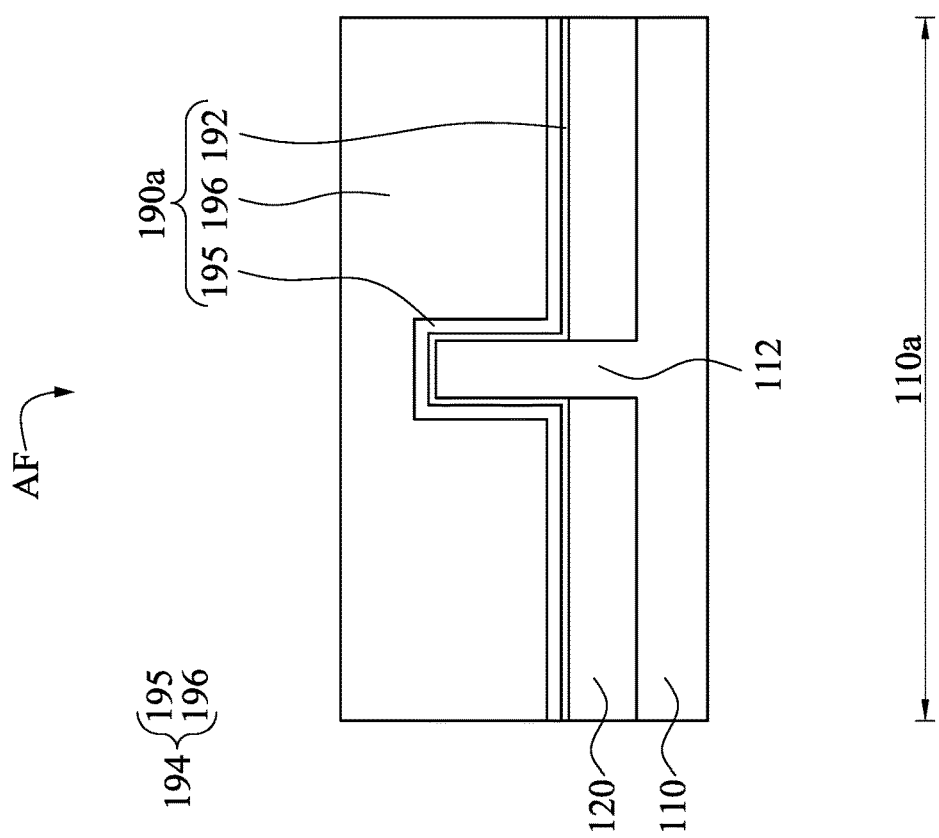

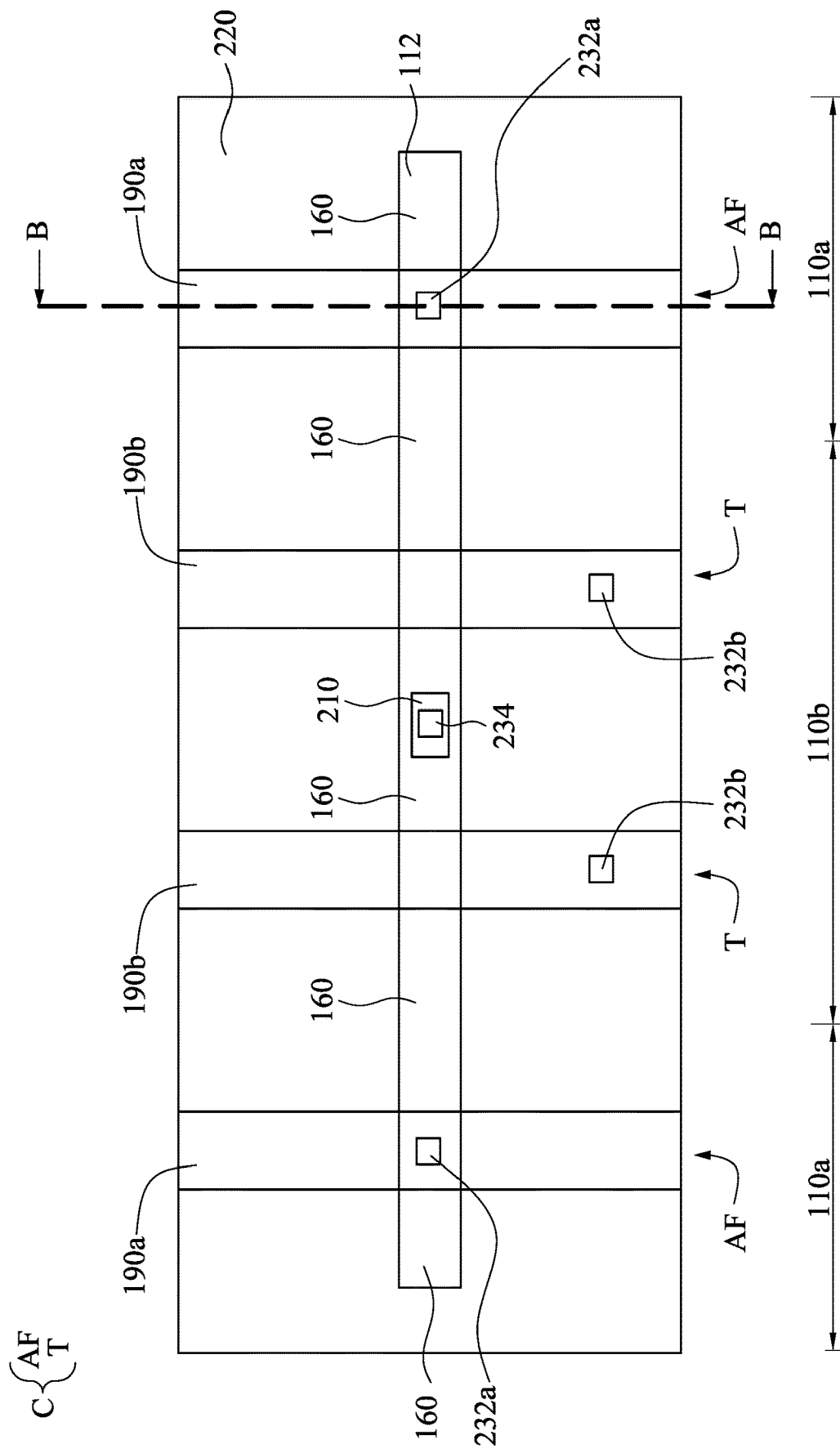

ONE-TIME PROGRAMMABLE MEMORY DEVICE INCLUDING ANTI-FUSE ELEMENT AND MANUFACTURING METHOD THEREOF

PRIORITY CLAIM AND CROSS-REFERENCE

This application is a continuation application of the U.S. application Ser. No. 16/786,099, filed on Feb. 10, 2020, which is herein incorporated by reference.

BACKGROUND

There are two main types of data storage elements. The first type is volatile memory, in which information stored in a particular storage element is lost the moment the power is removed from the memory. The second type is non-volatile storage element, in which the information is preserved even after the power is removed. Of the second type, some designs allow multiple programming, while other designs allow only one-time programming. Typically, the manufacturing techniques used to form the non-volatile memory are different from standard logic processes. Accordingly, the complexity and the cost for forming the non-volatile memory are high.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 11A is a top view of the memory cells in accordance with some embodiments of the present disclosure.

DETAILED DESCRIPTION

Figure 1A:
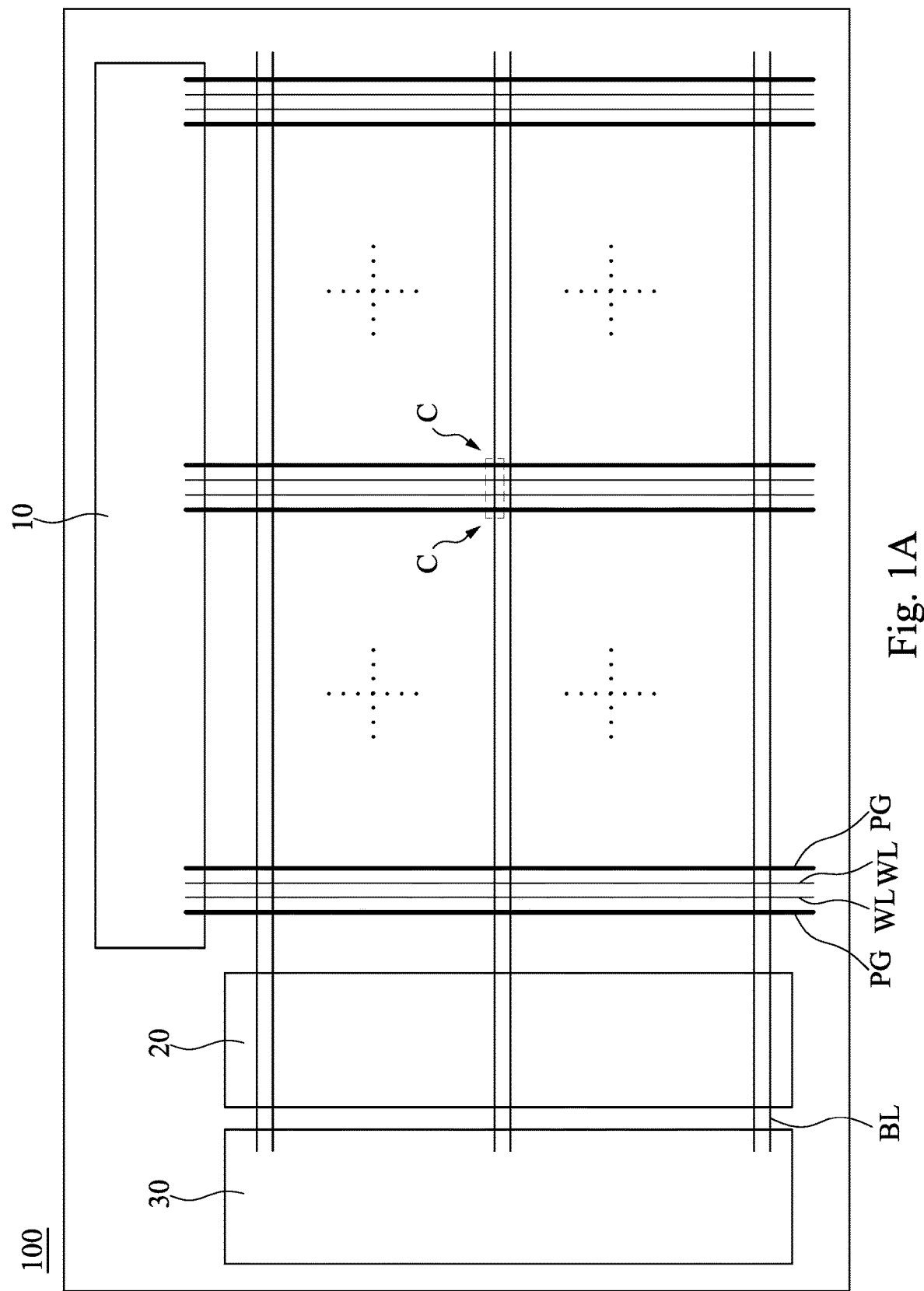
FIG. 1A is a schematic top view illustrating an exemplary memory device 100 according to some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

As used herein, "around", "about", "approximately", or "substantially" shall generally mean within 20 percent, or within 10 percent, or within 5 percent of a given value or range. Numerical quantities given herein are approximated, meaning that the term "around", "about", "approximately", or "substantially" can be inferred if not expressly stated.

The fins may be patterned by any suitable method. For example, the fins may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the fins.

Ante-fuse one-time programmable (OTP) devices according to some embodiments have an anti-fuse element connected to a transistor. Anti-fuses are incorporated in the design of the integrated circuits, and are selectively blown, for example, by passing an electrical current and voltage of a sufficient magnitude to create a less resistive path or a closed circuit. The process of selectively blowing anti-fuses is referred to as "programming."

Some embodiments of the present disclosure relate to one-time programming devices with a gate via close to the channel of an anti-fuse element. With such configuration, the one-time programming devices have a single programming mode. These embodiments are discussed below in the context of forming finFET transistors having a single fin or multiple fins on a bulk silicon substrate.

FIG. 1A is a schematic top view illustrating an exemplary memory device 100 according to some embodiments of the present disclosure. In some embodiments, the memory device 100 in FIG. 1A is an one-time programmable (OTP) device. In FIG. 1A, the memory device 100 includes an array of memory cells C arranged in rows and columns, an X-decoder 10, a Y-decoder 20, and a sense amplifier 30. The X-decoder 10, the Y-decoder 20, and the sense amplifier 30 can be referred to as peripheral circuitry, and the memory cells C are in a memory region surrounded by the peripheral circuitry.

Figure 1B:
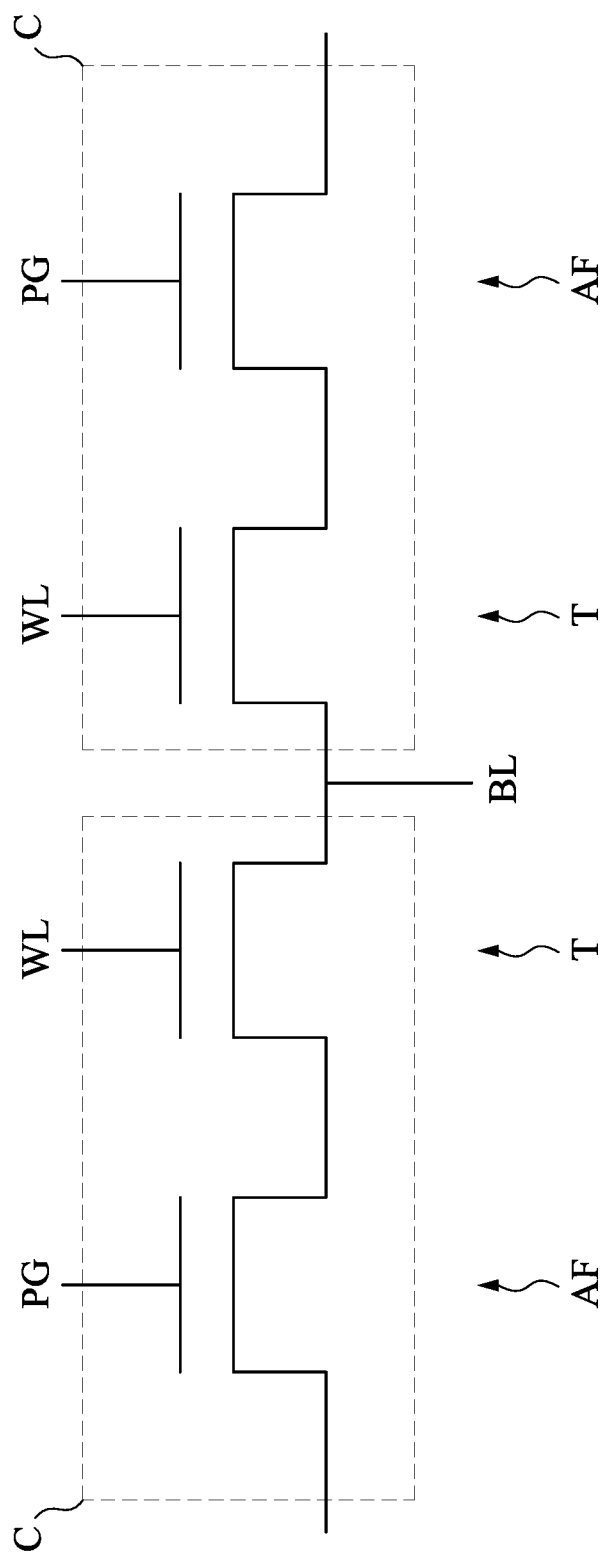
FIG. 1B is a circuit diagram of two adjacent memory cells in FIG. 1A according to some embodiments.

FIG. 1B is a circuit diagram of two adjacent memory cells C in FIG. 1A according to some embodiments. Reference is made to FIGS. 1A and 1B. Each of the memory cells C includes an anti-fuse element AF and a control transistor T. The control transistor T is electrically coupled with the anti-fuse element AF in series. Programming lines PG connected to gates of the anti-fuse elements AF may extend in a first direction (e.g., a Y-direction), and word lines WL connected to gates of the control transistor T may extend in the first direction. The source/drains of the anti-fuse element AF and the control transistor T are connected, and another of the source/drains of the control transistor T is coupled to a bit line BL, which extends in a second direction (e.g., an X-direction) different from the first direction. In some embodiments, the first direction and the second direction are substantially perpendicular to each other.

In FIG. 1A, the programming lines PG and the word lines WL are coupled to the X-decoder 10, and the bit lines BL are coupled to the Y-decoder 20 and the sense amplifier 30. The X-decoder 10 provides the X- or row-address of memory cells C to be accessed (e.g., memory cell C from which data is read or written to). The Y-decoder 20 provides the Y- or column address of memory cells C. The sense amplifier 30 is configured to detect a voltage difference between the bit lines BL identifying a stored state.

In some embodiments programming the memory cell C of the memory device 100 to "unselected" state, the control transistor T is turned off such that no substantial current flows through the anti-fuse element AF and the anti-fuse element AF is intact. In other embodiments programming the memory cell C of the memory device 100 to "selected" state, a voltage VCC is applied to the gate (the word line WL) of the control transistor T so as to turn on the control transistor T. The gate, which is connected to one of the programming lines PG, of the anti-fuse element AF is applied the high voltage. The turned-on control transistor T electrically couples a power voltage VSS and the anti-fuse element AF, such that a fuse current flows through both the control transistor T and the anti-fuse element AF. The fuse current can blow out the anti-fuse element AF, such that the resistance of the anti-fuse element AF decreases by a tremendous magnitude. The anti-fuse element AF is blow out and the state is logic "1". The anti-fuse element AF is not blow out and the state is logic "0".

Figure 2A:
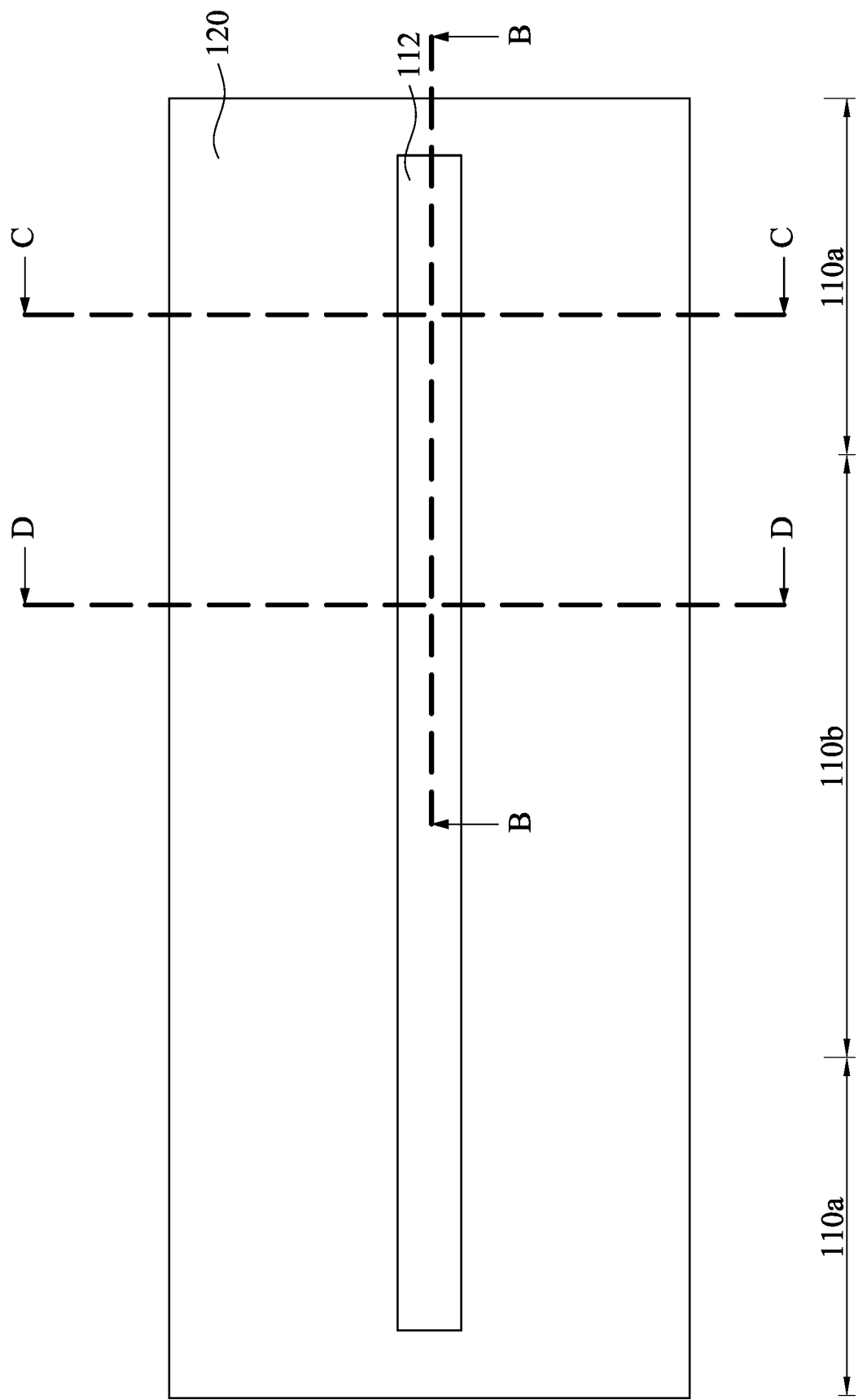
FIGS. 2A-9D illustrates a method for manufacturing two memory cells of FIG. 1B at various stages in accordance with some embodiments of the present disclosure.

FIGS. 2A-9D illustrate a method for manufacturing two memory cells C of FIG. 1B at various stages in accordance with some embodiments of the present disclosure. FIG. 2A is a top view of the memory cells C at some stages in accordance with some embodiments of the present disclosure, FIG. 2B is a cross-sectional view taking along line B-B of FIG. 2A, FIG. 2C is a cross-sectional view taking along line C-C of FIG. 2A, and FIG. 2D is a cross-sectional view taking along line D-D of FIG. 2A. A substrate 110 is provided. The substrate 110 includes at least one anti-fuse region 110a and at least one transistor region 110b. An anti-fuse element (such as the anti-fuse element AF in FIG. 1B) will be formed on the anti-fuse region 110a, and a transistor (such as the control transistor T in FIG. 1B) will be formed on the transistor region 110b. In some embodiments, the substrate 110 may include silicon (Si). Alternatively, the substrate 110 may include germanium (Ge), silicon germanium, gallium arsenide (GaAs) or other appropriate semiconductor materials. Also alternatively, the substrate 110 may include an epitaxial layer. For example, the substrate 110 may have an epitaxial layer overlying a bulk semiconductor. Further, the substrate 110 may be strained for performance enhancement. For example, the epitaxial layer may include a semiconductor material different from those of the bulk semiconductor such as a layer of silicon germanium overlying a bulk silicon or a layer of silicon overlying a bulk silicon germanium formed by a process including selective epitaxial growth (SEG). Furthermore, the substrate 110 may include a semiconductor-on-insulator (SOI) structure such as a buried dielectric layer. Also alternatively, the substrate 110 may include a buried dielectric layer such as a buried oxide (BOX) layer, such as that formed by a method referred to as separation by implantation of oxygen (SIMOX) technology, wafer bonding, SEG, or other appropriate method. In various embodiments may include any of a variety of substrate structures and material.

The substrate 110 further includes at least one semiconductor fin 112 protruding from the substrate 110. The semiconductor fin 112 serve as source/drain regions of the following formed anti-fuse element AF and the control transistor T (see FIG. 6A). It is note that the numbers of the semiconductor fin 112 in FIGS. 2A-2D are illustrative, and should not limit the claimed scope of the present disclosure. The semiconductor fin 112 may be formed, for example, by patterning and etching the substrate 110 using photolithography techniques. In some embodiments, a layer of photoresist material (not shown) is deposited over the substrate 110. The layer of photoresist material is irradiated (exposed) in accordance with a desired pattern (the semiconductor fin 112) and developed to remove portions of the photoresist material. The remaining photoresist material protects the underlying material from subsequent processing operations, such as etching. It should be noted that other masks, such as an oxide or silicon nitride mask, may also be used in the etching process.

In some other embodiments, the semiconductor fin 112 may be epitaxially grown. For example, exposed portions of an underlying material, such as an exposed portion of the substrate 110, may be used in an epitaxial process to form the semiconductor fin 112. A mask may be used to control the shape of the semiconductor fin 112 during the epitaxial growth process.

A plurality of isolation features 120, such as shallow trench isolation (STI), are formed in the substrate 110 to separate various devices. The formation of the isolation features 120 may include etching trenches in the substrate 110 and filling the trenches by insulator materials such as silicon oxide, silicon nitride, or silicon oxynitride. The filled trench may have a multi-layer structure such as a thermal oxide liner layer with silicon nitride filling the trench. In some embodiments, the isolation features 120 may be created using a process sequence such as: growing a pad oxide, forming a low pressure chemical vapor deposition (LPCVD) nitride layer, patterning an STI opening using photoresist and masking, etching a trench in the substrate 110, optionally growing a thermal oxide trench liner to improve the trench interface, filling the trench with CVD oxide, and using chemical mechanical planarization (CMP) to remove the excessive dielectric layers.

Figure 3A:
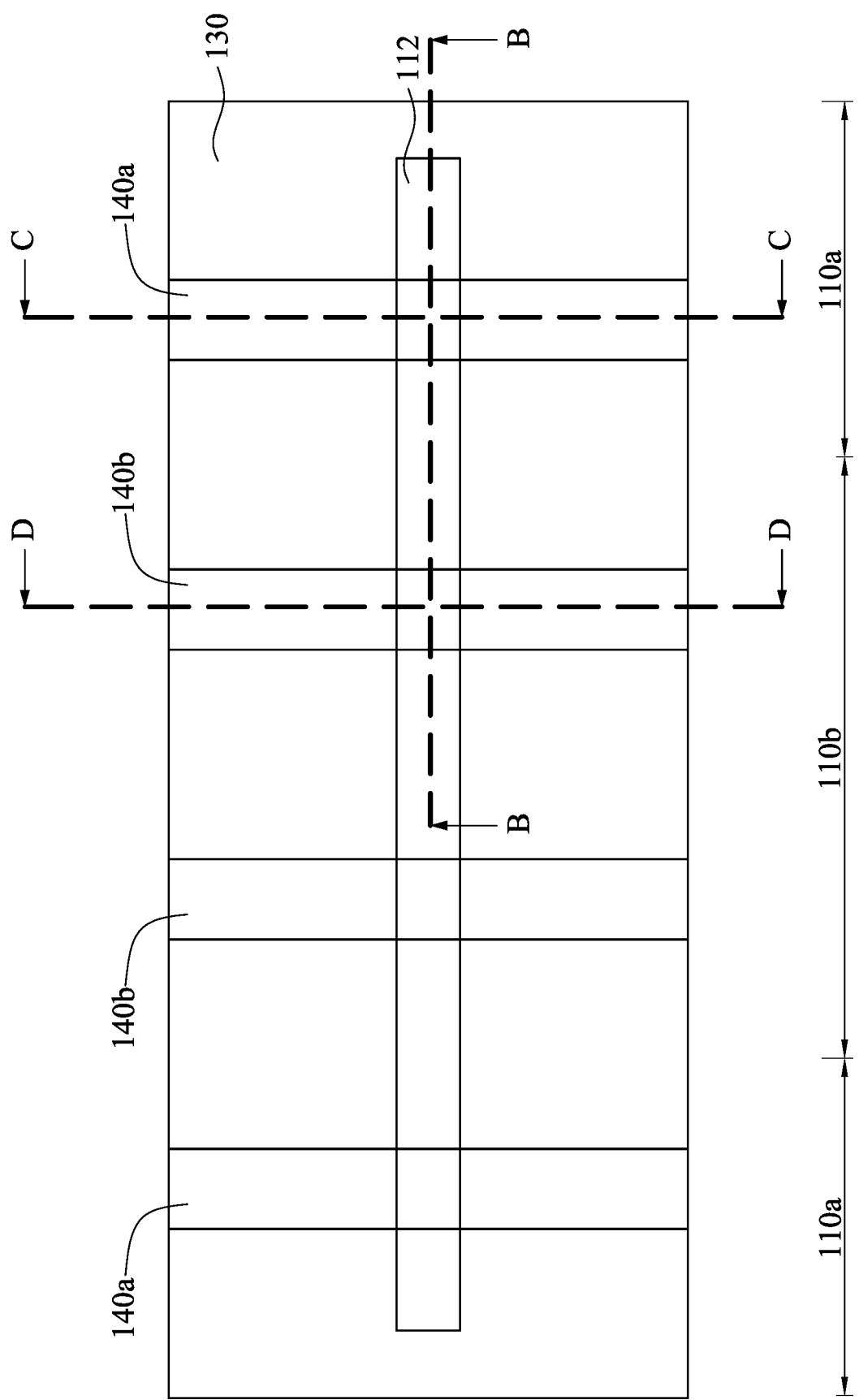
Figure 3B:
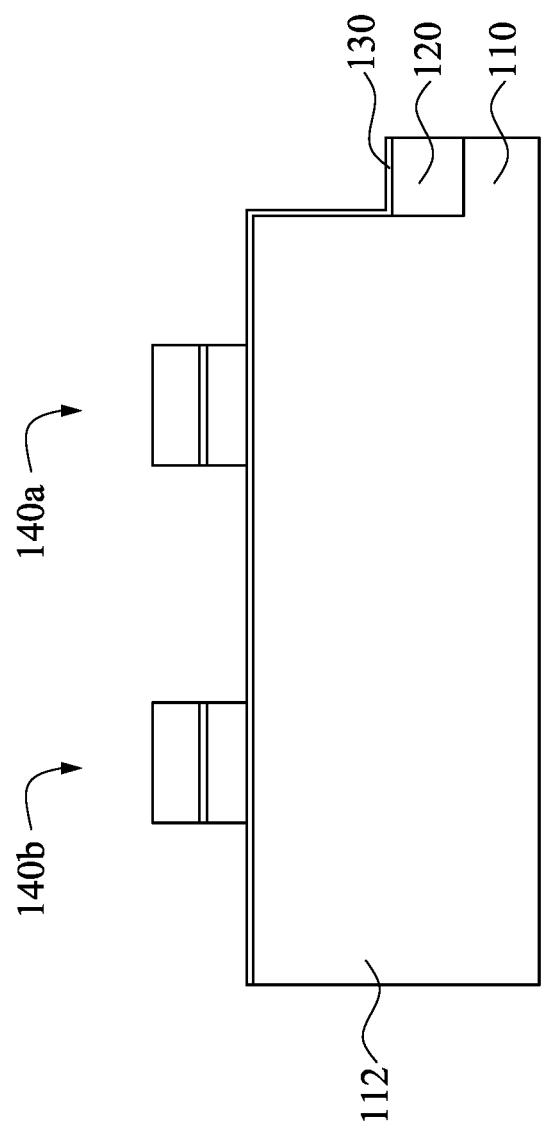
Figure 3D:
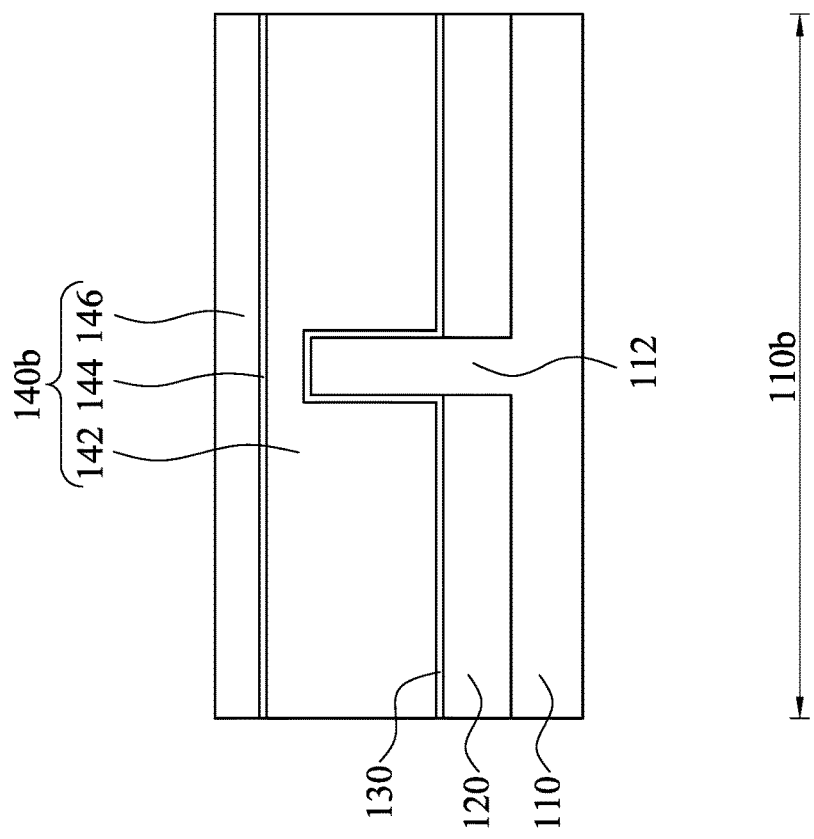
Figure 3C:
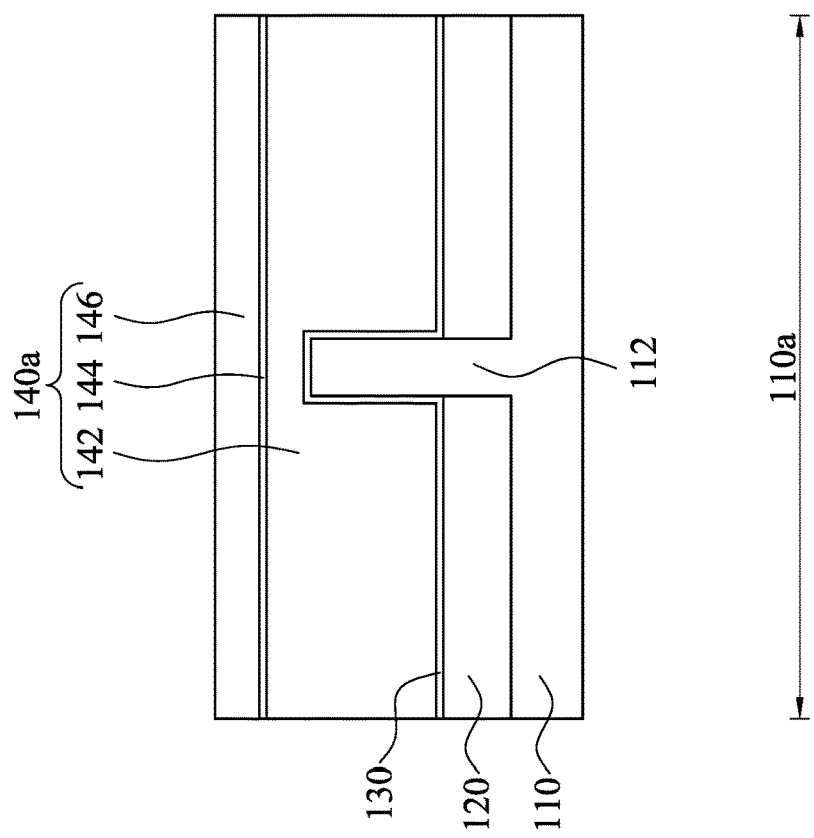

FIG. 3A is a top view of the memory cells C at some stages in accordance with some embodiments of the present disclosure, FIG. 3B is a cross-sectional view taking along line B-B of FIG. 3A, FIG. 3C is a cross-sectional view taking along line C-C of FIG. 3A, and FIG. 3D is a cross-sectional view taking along line D-D of FIG. 3A. A dummy dielectric layer 130 is conformally formed to cover the semiconductor fin 112 and the isolation structures 120. In some embodiments, the dummy dielectric layer 130 may include silicon dioxide, silicon nitride, a high-κ dielectric material or other suitable material. In various examples, the dummy dielectric layer 130 may be deposited by an ALD process, a CVD process, a subatmospheric CVD (SACVD) process, a flowable CVD process, a PVD process, or other suitable process. By way of example, the dummy dielectric layer 130 may be used to prevent damage to the semiconductor fin 112 by subsequent processing (e.g., subsequent formation of the dummy gate structure).

Subsequently, dummy gate stacks 140a and 140b are formed above the dummy dielectric layer 130 and the semiconductor fin 112. Each of the dummy gate stacks 140a and 140b includes a dummy gate electrode 142, a pad layer 144 formed over the dummy gate electrode 142, and a hard mask layer 146 formed over the pad layer 144. In some embodiments, a dummy gate layer (not shown) may be formed over the dummy dielectric layer 130, and the pad layer 144 and the hard mask layer 146 are formed over the dummy gate layer. The dummy gate layer is then patterned using the pad layer 144 and the hard mask layer 146 as masks to form the dummy gate electrode 142. As such, the dummy gate electrode 142, the pad layer 144, and the hard mask layer 146 are referred to as the dummy gate stacks 140a and 140b. In some embodiments, the dummy gate electrode 142 may be made of polycrystalline-silicon (poly-Si), poly-crystalline silicon-germanium (poly-SiGe), or other suitable materials. The pad layer 144 may be made of silicon dioxide or other suitable materials, and the hard mask layer 146 may be made of silicon nitride or other suitable materials.

Figure 4A:
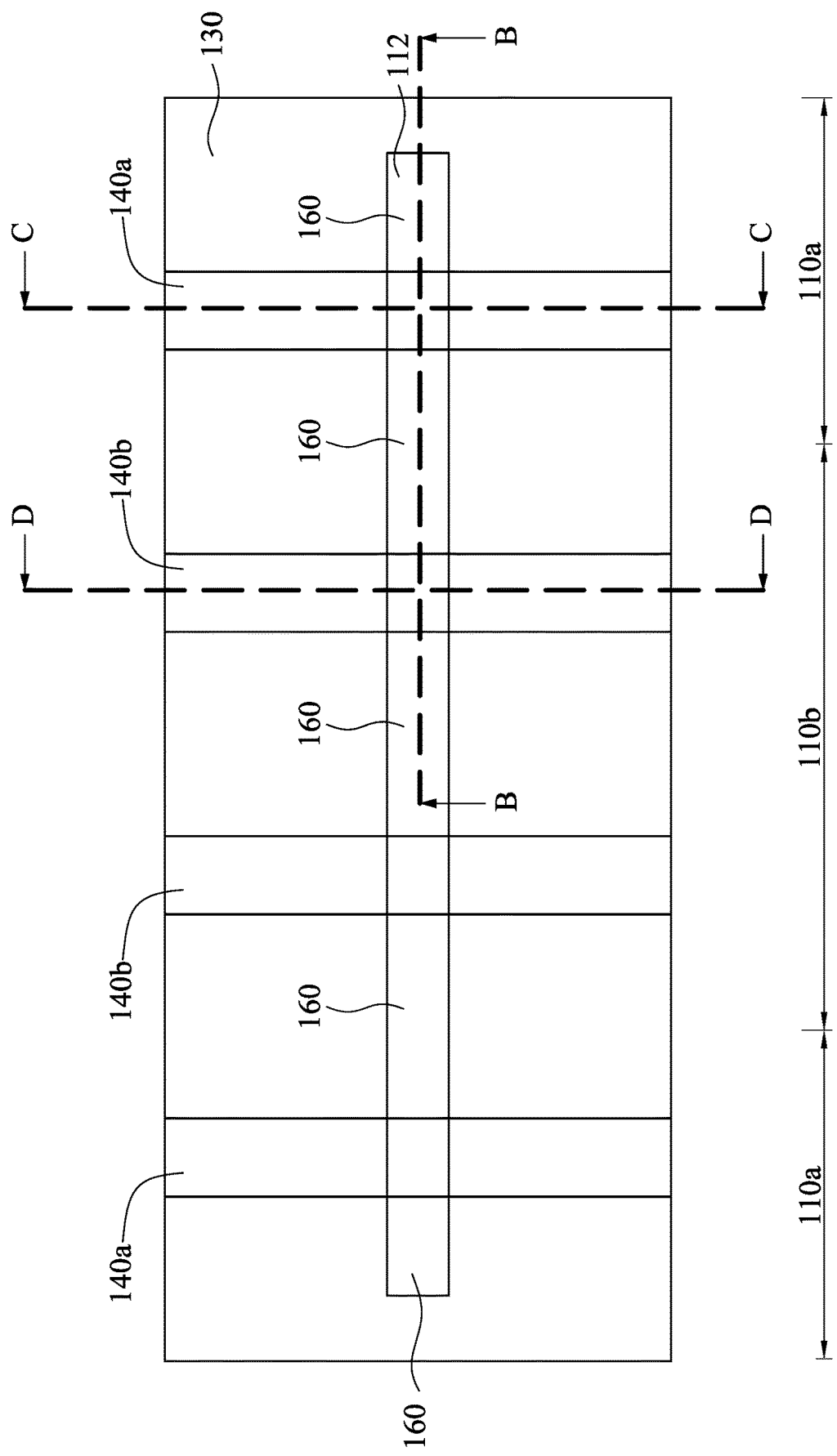
Figure 4B:
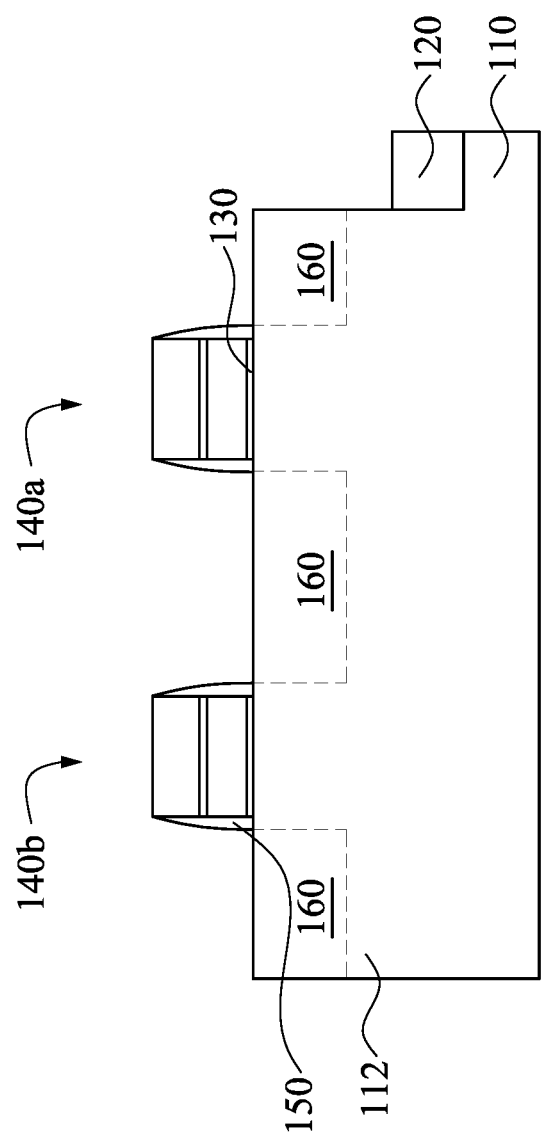
Figure 4D:
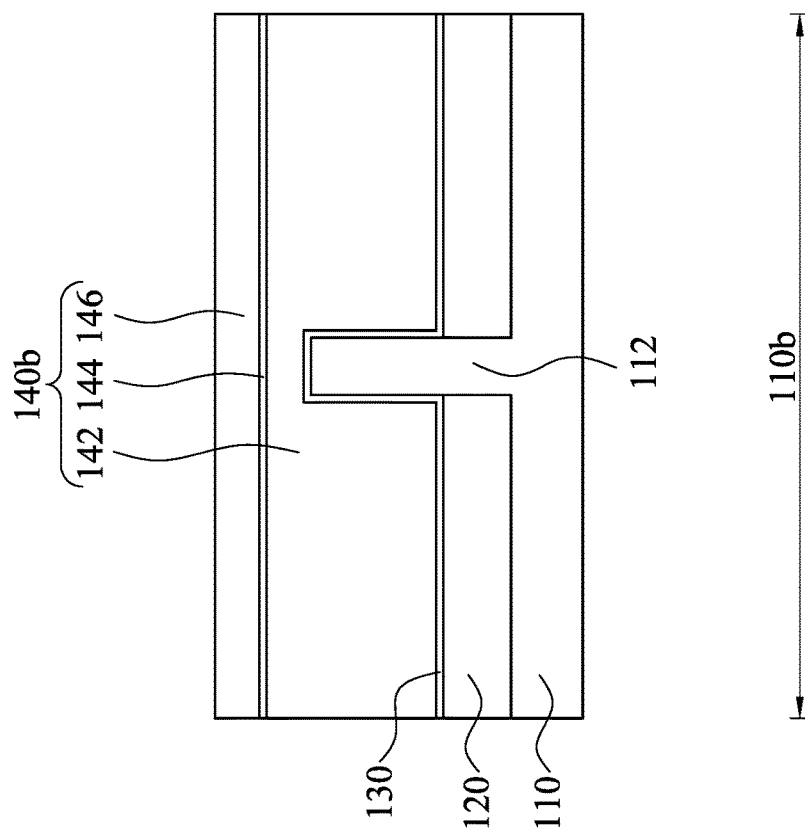
Figure 4C:
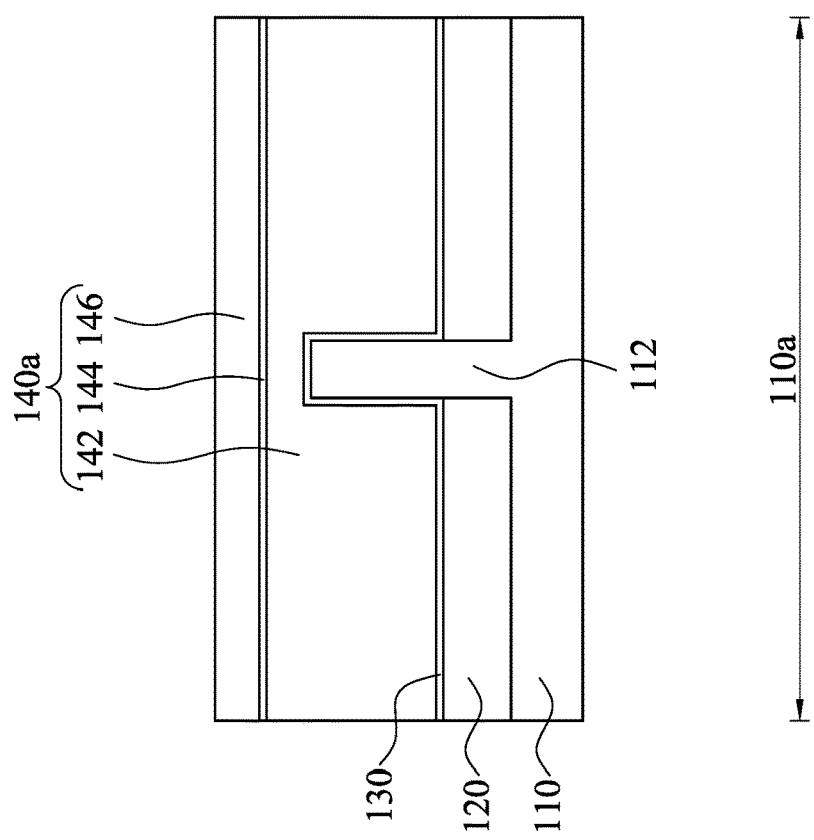

FIG. 4A is a top view of the memory cell C at some stages in accordance with some embodiments of the present disclosure, FIG. 4B is a cross-sectional view taking along line B-B of FIG. 4A, FIG. 4C is a cross-sectional view taking along line C-C of FIG. 4A, and FIG. 4D is a cross-sectional view taking along line D-D of FIG. 4A. Portions of the dummy dielectric layer 130 uncovered by the dummy gate stacks 140a and 140b are removed to expose the semiconductor fin 112. Spacer structures 150 are then formed at least on opposite sides of the dummy gate stacks 140a and 140b. For clarity, the spacer structures 150 are illustrated in FIG. 4B and are omitted in FIG. 4A. The spacer structures 150 may include a seal spacer and a main spacer (not shown). The spacer structures 150 include one or more dielectric materials, such as silicon oxide, silicon nitride, silicon oxynitride, SiCN, $SiC_xO_yN_z$, or combinations thereof. The seal spacers are formed on sidewalls of the dummy gate stack 140a and 140b and the main spacers are formed on the seal spacers. The spacer structures 150 can be formed using a deposition method, such as plasma enhanced chemical vapor deposition (PECVD), low-pressure chemical vapor deposition (LPCVD), sub-atmospheric chemical vapor deposition (SACVD), or the like. The formation of the spacer structures 150 may include blanket forming spacer layers and then performing etching operations to remove the horizontal portions of the spacer layers. The remaining vertical portions of the spacer layers form the spacer structures 150.

In some embodiments, source/drain regions 160 are formed in portions of the semiconductor fin 112. For example, an implantation process can be performed to dope the portions of the semiconductor fin 112 uncovered by the dummy gate stacks 140a, 140b and the spacer structures 150. The dopants may be n-type dopants or p-type dopants. In some embodiments, the source/drain regions of the following formed anti-fuse element AF and the control transistor T may have the same conductivity type.

In some other embodiments, epitaxial structures are formed on portions of the semiconductor fin uncovered by the dummy gate stacks 140a, 140b and the spacer structures 150 by performing, for example, a selectively growing process. The epitaxial structures are formed by epitaxially growing a semiconductor material. The semiconductor material includes single element semiconductor material, such as germanium (Ge) or silicon (Si), compound semiconductor materials, such as gallium arsenide (GaAs) or aluminum gallium arsenide (AlGaAs), or semiconductor alloy, such as silicon germanium (SiGe) or gallium arsenide phosphide (GaAsP). The epitaxial structures have suitable crystallographic orientations (e.g., a (100), (110), or (111) crystallographic orientation). In some embodiments, the epitaxial structures include source/drain epitaxial structures. In some embodiments, where an N-type device is desired, the epitaxial structures may include an epitaxially growing silicon phosphorus (SiP) or silicon carbon (SiC). In some embodiments, where a P-type device is desired, the epitaxial structures may include an epitaxially growing silicon germanium (SiGe). The epitaxial processes include CVD deposition techniques (e.g., vapor-phase epitaxy (VPE) and/or ultra-high vacuum CVD (UHV-CVD)), molecular beam epitaxy, and/or other suitable processes.

Figure 5A:
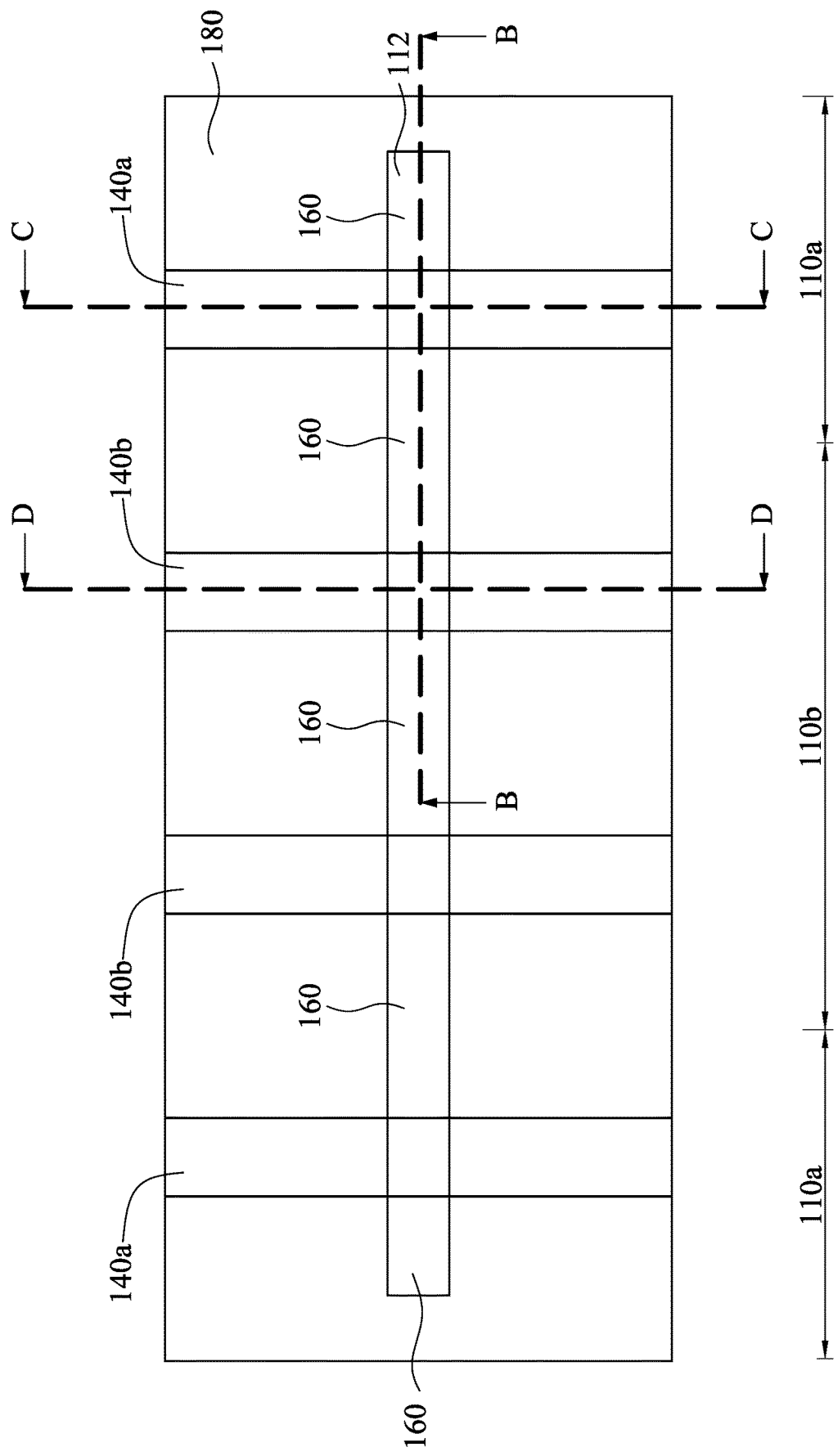
Figure 5B:
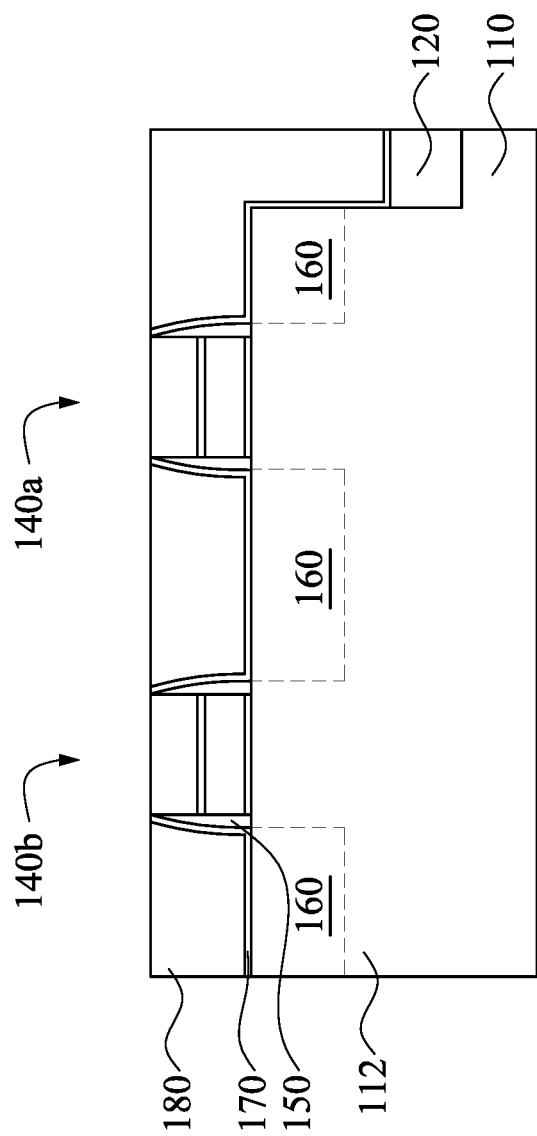
Figure 5D:
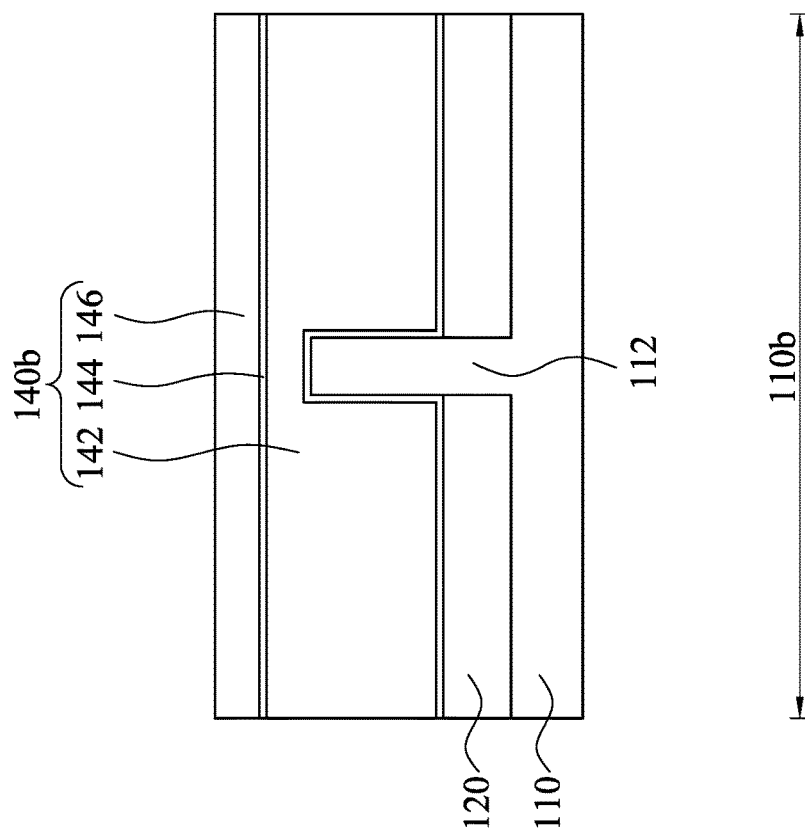
Figure 5C:
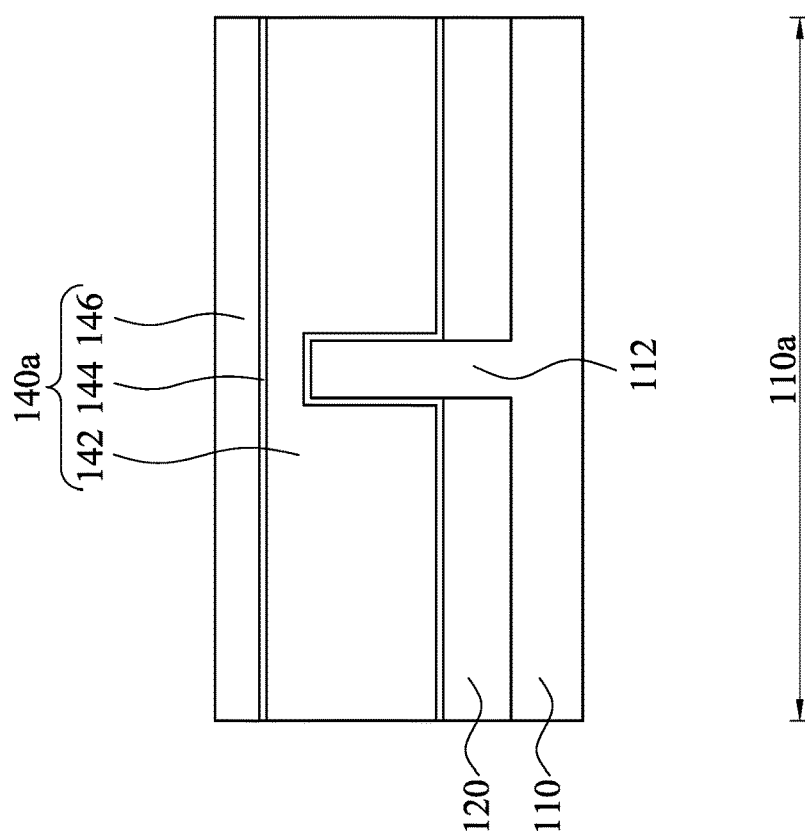

FIG. 5A is a top view of the memory cells C at some stages in accordance with some embodiments of the present disclosure, FIG. 5B is a cross-sectional view taking along line B-B of FIG. 5A, FIG. 5C is a cross-sectional view taking along line C-C of FIG. 5A, and FIG. 5D is a cross-sectional view taking along line D-D of FIG. 5A. A contact etch stop layer (CESL) 170 is conformally formed over the structure of FIGS. 4A-4D. In some embodiments, the CESL 170 can be a stressed layer or layers. In some embodiments, the CESL 170 has a tensile stress and is formed of $Si_3N_4$. In some other embodiments, the CESL 170 includes materials such as oxynitrides. In yet some other embodiments, the CESL 170 may have a composite structure including a plurality of layers, such as a silicon nitride layer overlying a silicon oxide layer. The CESL 170 can be formed using plasma enhanced CVD (PECVD), however, other suitable methods, such as low pressure CVD (LPCVD), atomic layer deposition (ALD), and the like, can also be used.

A first interlayer dielectric (ILD) 180 is then formed on the CESL 170. The first ILD 180 may be formed by chemical vapor deposition (CVD), high-density plasma CVD, spin-on, sputtering, or other suitable methods. In some embodiments, the first ILD 180 includes silicon oxide. In some other embodiments, the first ILD 180 may include silicon oxy-nitride, silicon nitride, or a low-k material.

Figure 6A:
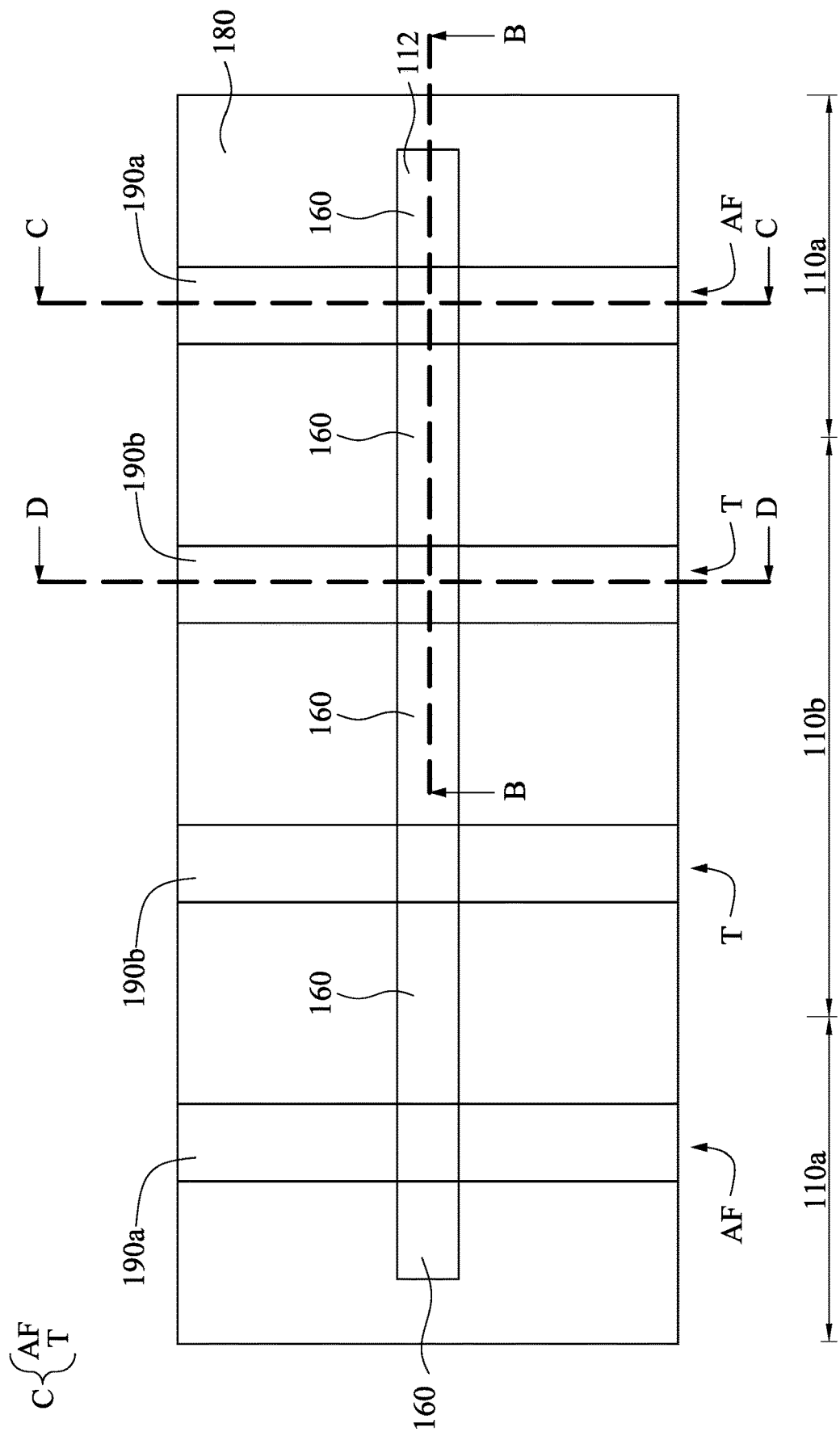
Figure 6B:
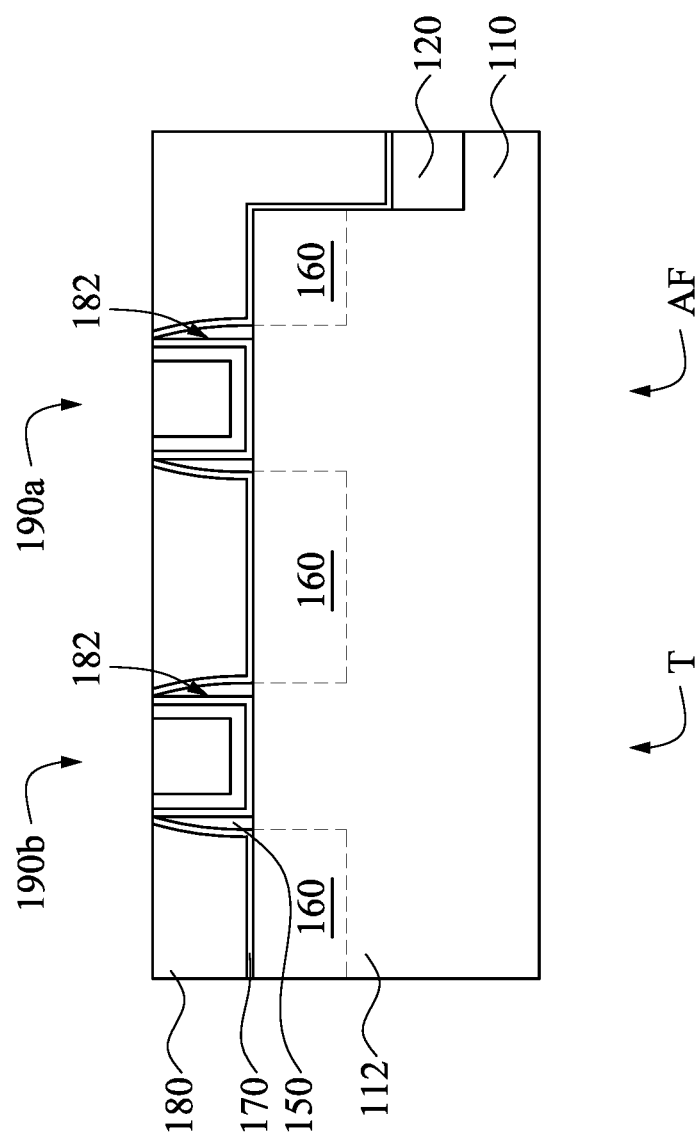
Figure 6D:
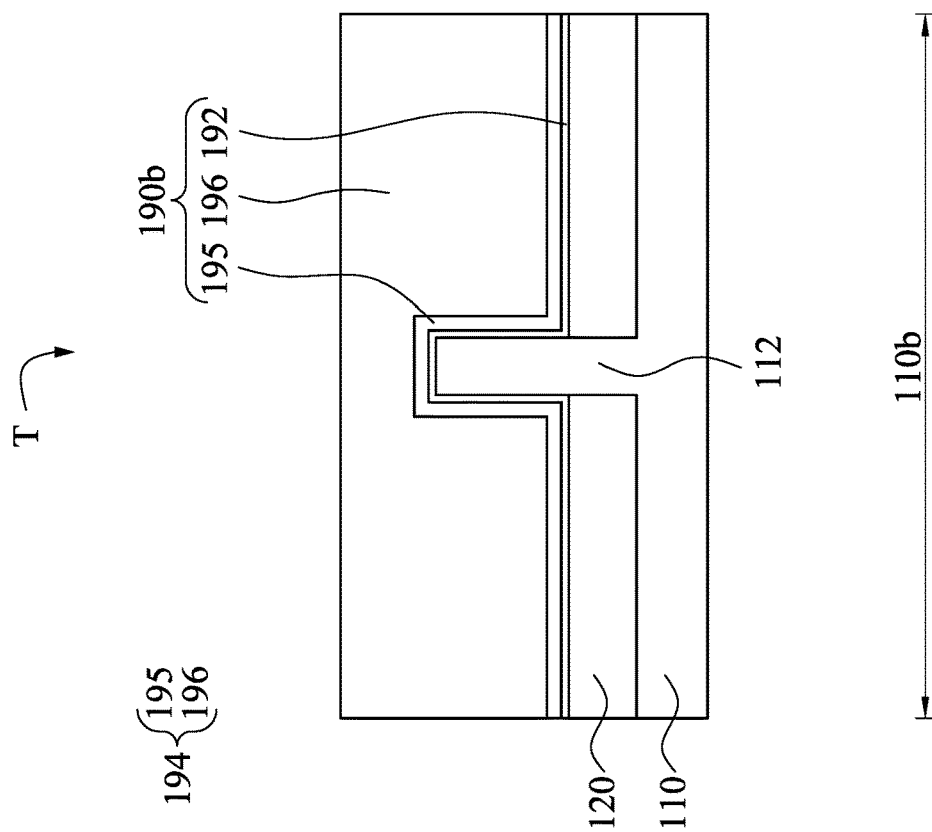
Figure 6C:
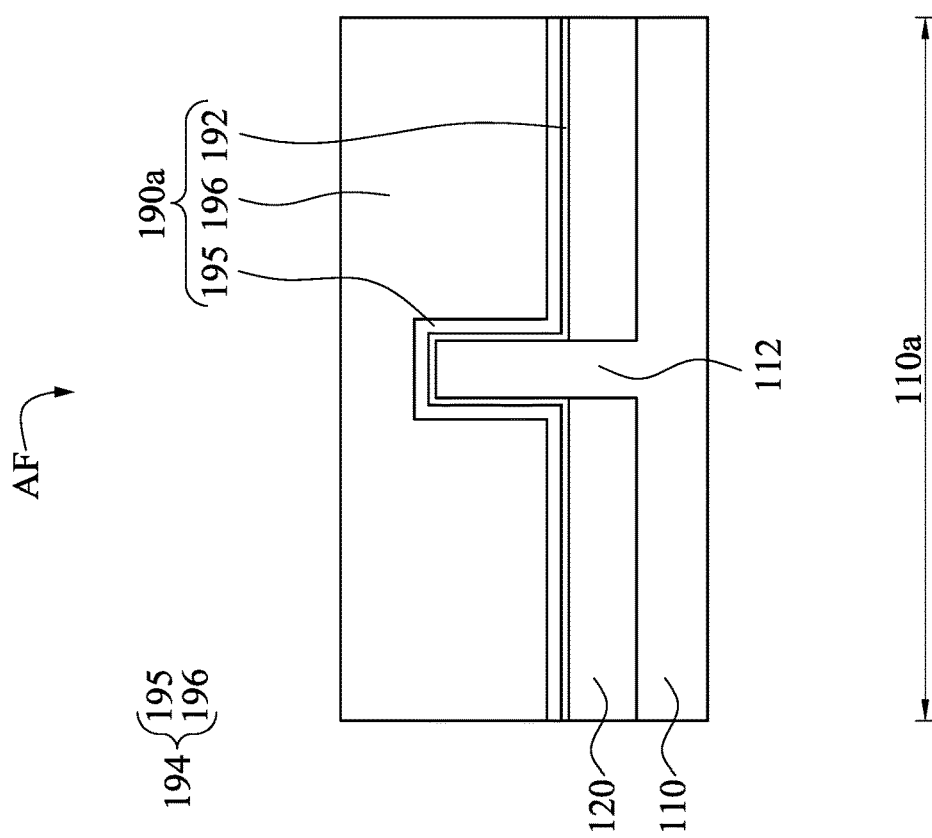

FIG. 6A is a top view of the memory cells C at some stages in accordance with some embodiments of the present disclosure, FIG. 6B is a cross-sectional view taking along line B-B of FIG. 6A, FIG. 6C is a cross-sectional view taking along line C-C of FIG. 6A, and FIG. 6D is a cross-sectional view taking along line D-D of FIG. 6A. A replacement gate (RPG) process scheme is employed. In the RPG process scheme, a dummy polysilicon gate (the dummy gate stacks 140a and 140b of FIGS. 5A-5D in this case) is formed in advance and is replaced later by a metal gate. In some embodiments, the dummy gate stacks 140a and 140b are removed to respectively form openings 182 with the spacer structures 150 as their sidewalls. In some other embodiments, the dummy dielectric layers 130 (see FIGS. 5B-5D) are removed as well. The dummy gate stacks 140a and 140b (and the dummy dielectric layers 130) may be removed by dry etch, wet etch, or a combination of dry and wet etch. For example, a wet etch process may include exposure to a hydroxide containing solution (e.g., ammonium hydroxide), deionized water, and/or other suitable etchant solutions.

A gate dielectric layer 192 is formed in the openings 182, and at least one metal layer is formed in the openings 182 and on the gate dielectric layer 192. Subsequently, a chemical mechanical planarization (CMP) process is performed to planarize the metal layer and the gate dielectric layer 192 to form metal gate stacks 190a and 190b respectively in the openings 182. The metal gate structures 190a and 190b cross over the semiconductor fin 112. Each of the metal gate structures 190a and 190b includes the gate dielectric layer 192 and a metal gate electrode 194 over the gate dielectric layer 192. The metal gate electrode 194 may include metal layers 195, e.g., work function metal layer(s) and capping layer(s), a fill layer(s) 196, and/or other suitable layers that are desirable in a metal gate stack. The work function metal layer may include n-type and/or p-type work function metal. Exemplary n-type work function metals include Ti, Ag, TaAl, TaAlC, TiAlN, TaC, TaCN, TaSiN, Mn, Zr, other suitable n-type work function materials, or combinations thereof. Exemplary p-type work function metals include TiN, TaN, Ru, Mo, Al, WN, ZrSi$_2$, MoSi$_2$, TaSi$_2$, NiSi$_2$, WN, other suitable p-type work function materials, or combinations thereof. The work function metal layer may have multiple layers. The work function metal layer(s) may be deposited by CVD, PVD, electroplating and/or other suitable process. In some embodiments, the metal gate electrode is a p-type metal gate including a p-type work function metal layer. In some embodiments, the capping layer in the metal gate electrodes may include refractory metals and their nitrides (e.g. TiN, TaN, W$_2$N, TiSiN, TaSiN). The capping layer may be deposited by PVD, CVD, metal-organic chemical vapor deposition (MOCVD) ALD, or the like. In some embodiments, the fill layer 196 in the metal gate electrodes may include tungsten (W). The fill layer 196 may be deposited by ALD, PVD, CVD, or other suitable process.

In FIGS. 6A and 6C, an anti-fuse element AF is formed above the anti-fuse region 110a of the substrate 110. The anti-fuse element AF includes a portion of the semiconductor fin 112 and the metal gate structure 190a crosses over the semiconductor fin 112, where a portion of the semiconductor fin 112 covered by the metal gate structure 190a is referred to as a channel of the anti-fuse element AF. The source/drain regions 160 of the anti-fuse element AF are formed in the semiconductor fin 112 and on opposite sides of the metal gate structure 190a. Further, a control transistor T is formed above the transistor region 110b of the substrate 110. The control transistor T includes another portion of the semiconductor fin 112 and the metal gate structure 190b crosses over the semiconductor fin 112, where a portion of the semiconductor fin 112 covered by the metal gate structure 190b is referred to as a channel of the control transistor T. The source/drain regions 160 of the control transistor T are formed in the semiconductor fin 112 and on opposite sides of the metal gate structure 190b. Further, the adjacent anti-fuse element AF and the control transistor T form a memory cell C, and adjacent memory cells C have a symmetric configuration.

Figure 7A:
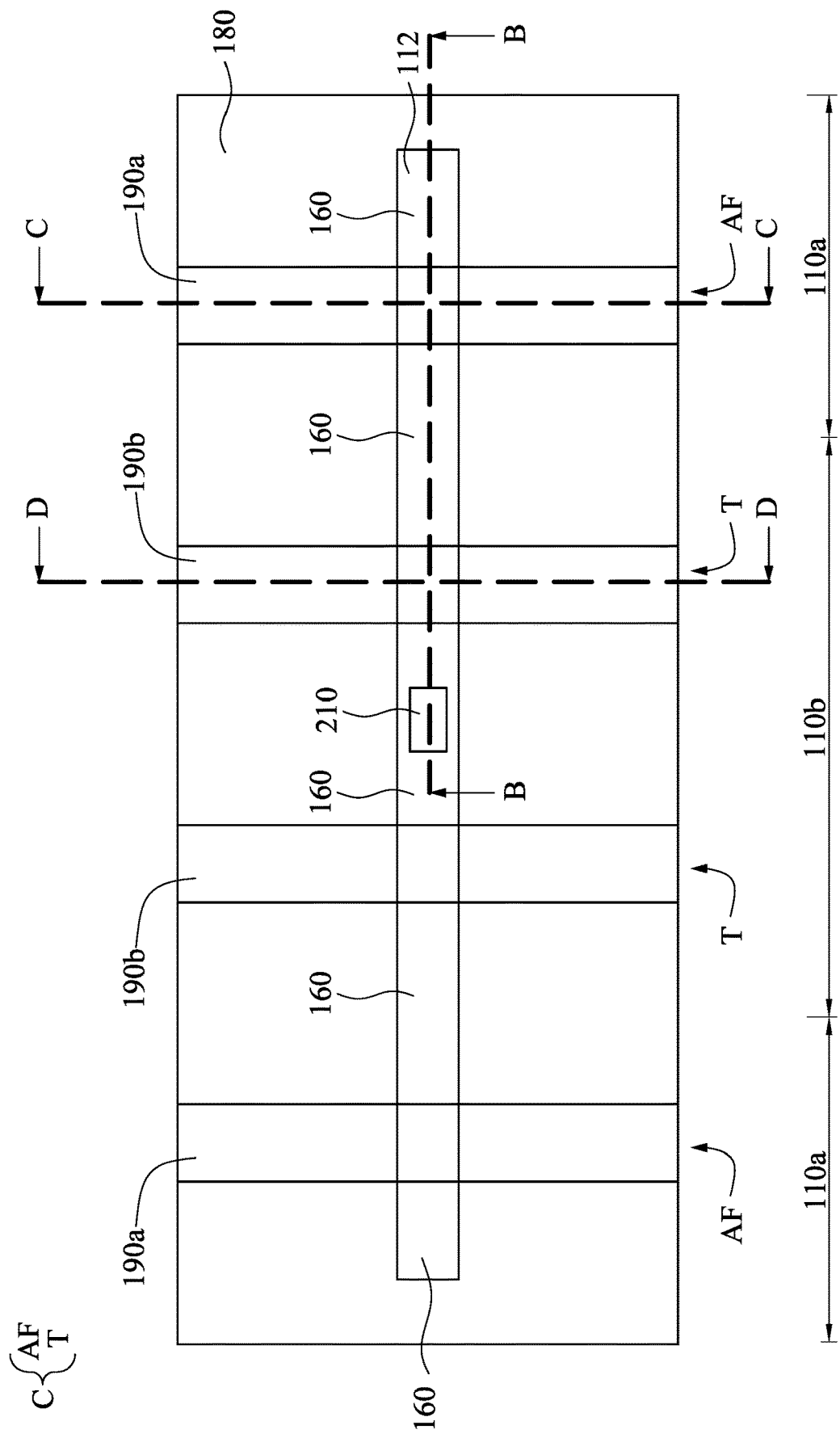
Figure 7B:
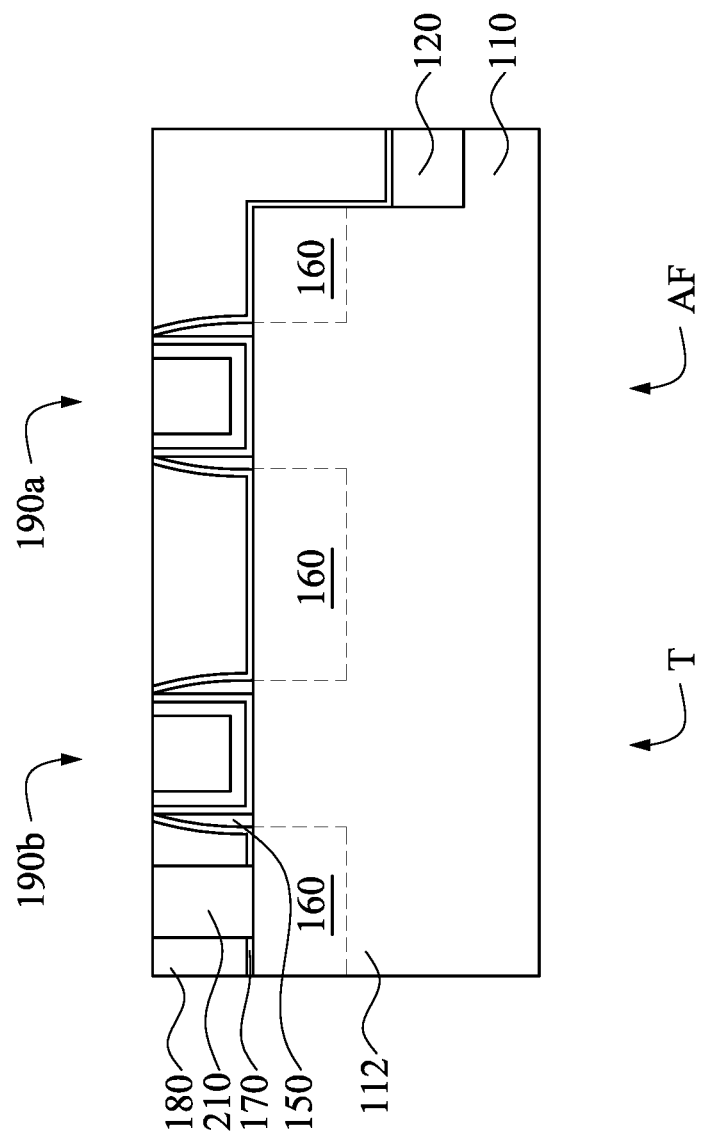

FIG. 7A is a top view of the memory cells C at some stages in accordance with some embodiments of the present disclosure, FIG. 7B is a cross-sectional view taking along line B-B of FIG. 7A, FIG. 7C is a cross-sectional view taking along line C-C of FIG. 7A, and FIG. 7D is a cross-sectional view taking along line D-D of FIG. 7A. At least one contact 210 is formed over the source/drain region 160 shared by two adjacent control transistors T. For example, at least one opening is formed in the first ILD 180, and conductive materials are filled in the opening. The excess portions of the conductive materials are removed to form the contact 210. The contact 210 may be made of tungsten, aluminum, copper, or other suitable materials.

Figure 8A:
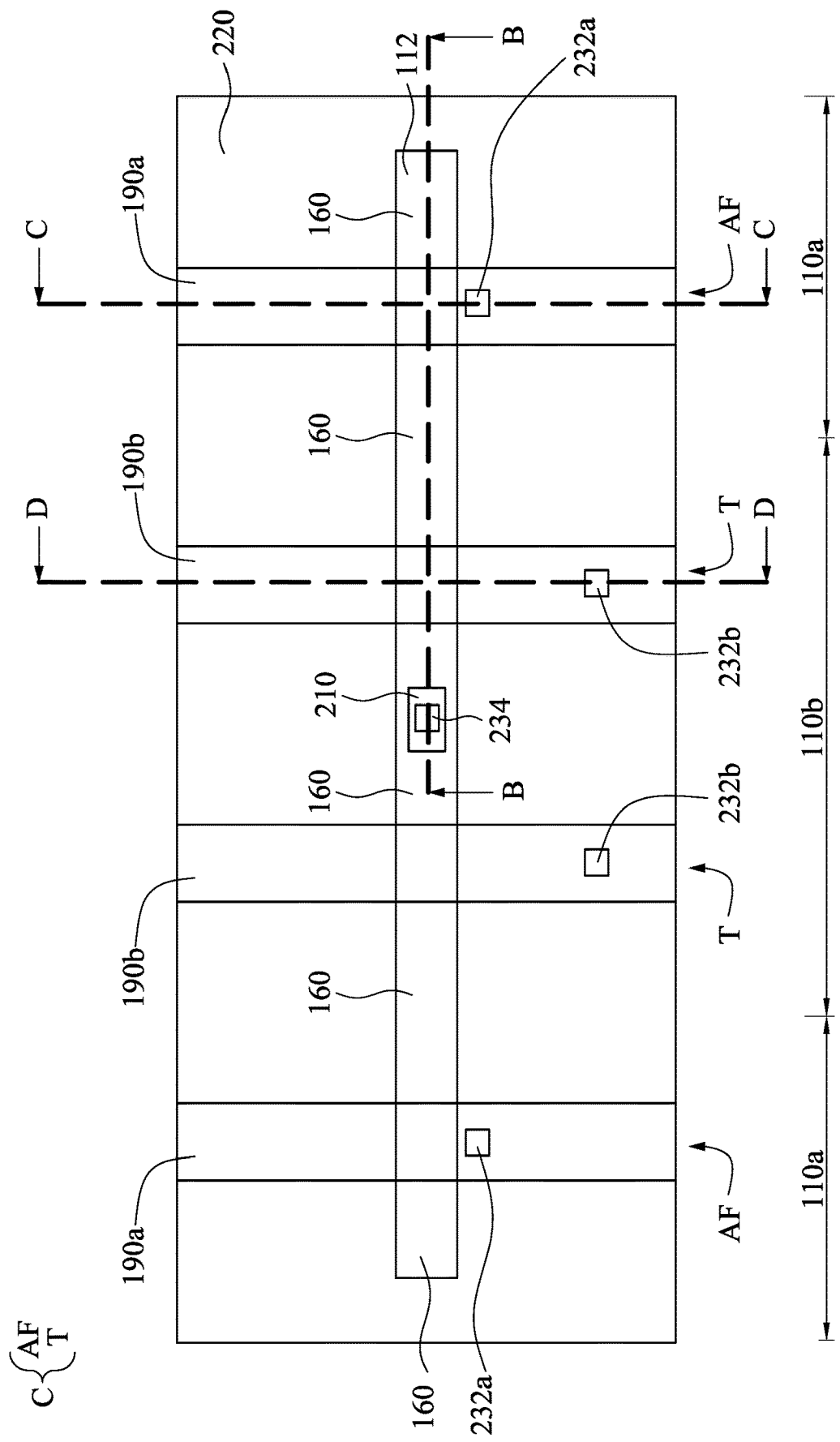
Figure 8B:
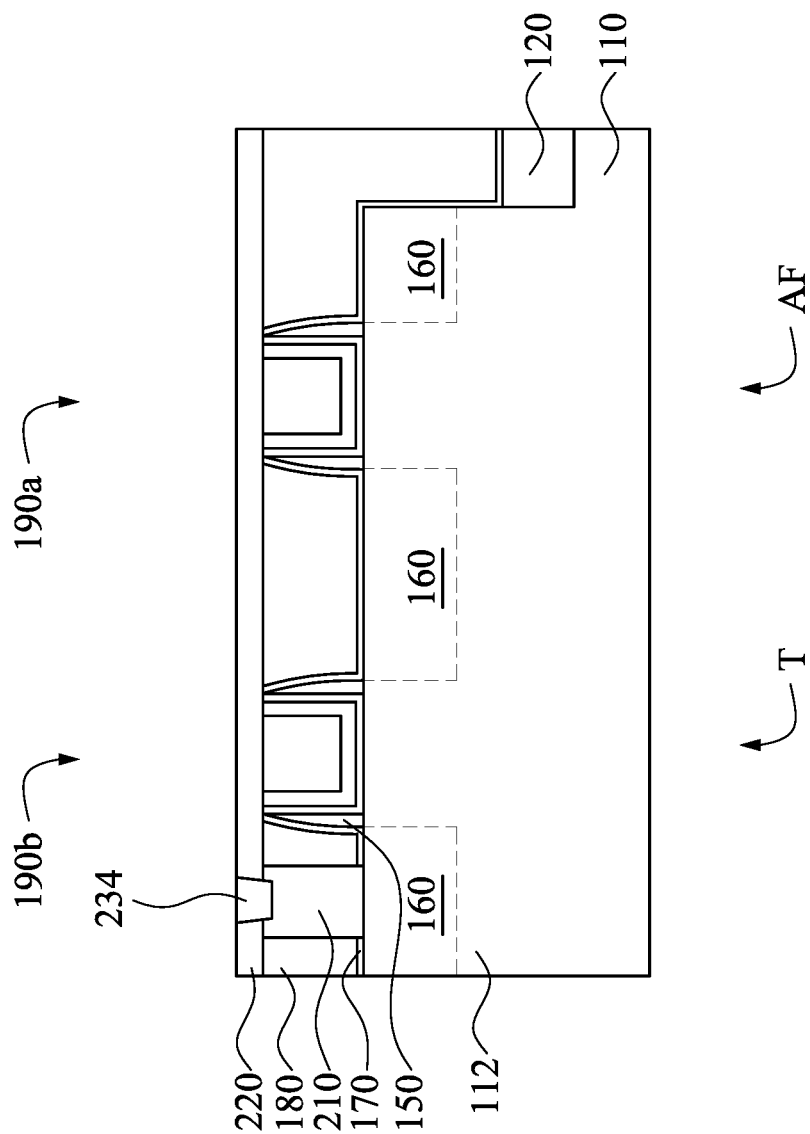
Figure 8D:
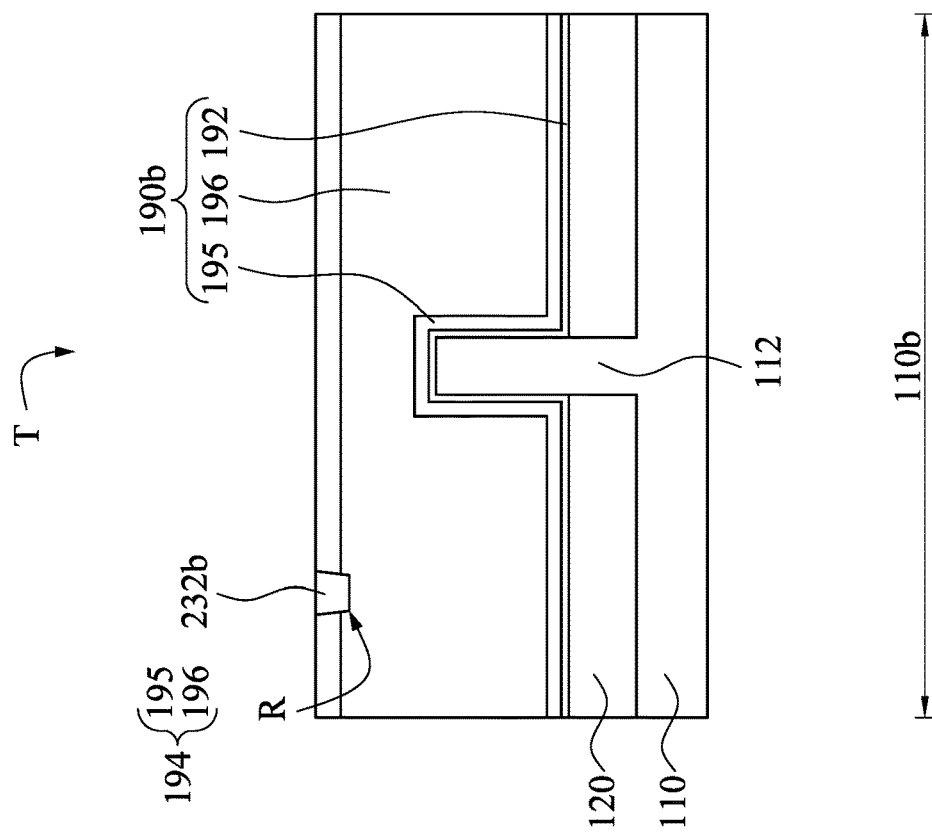
Figure 8C:
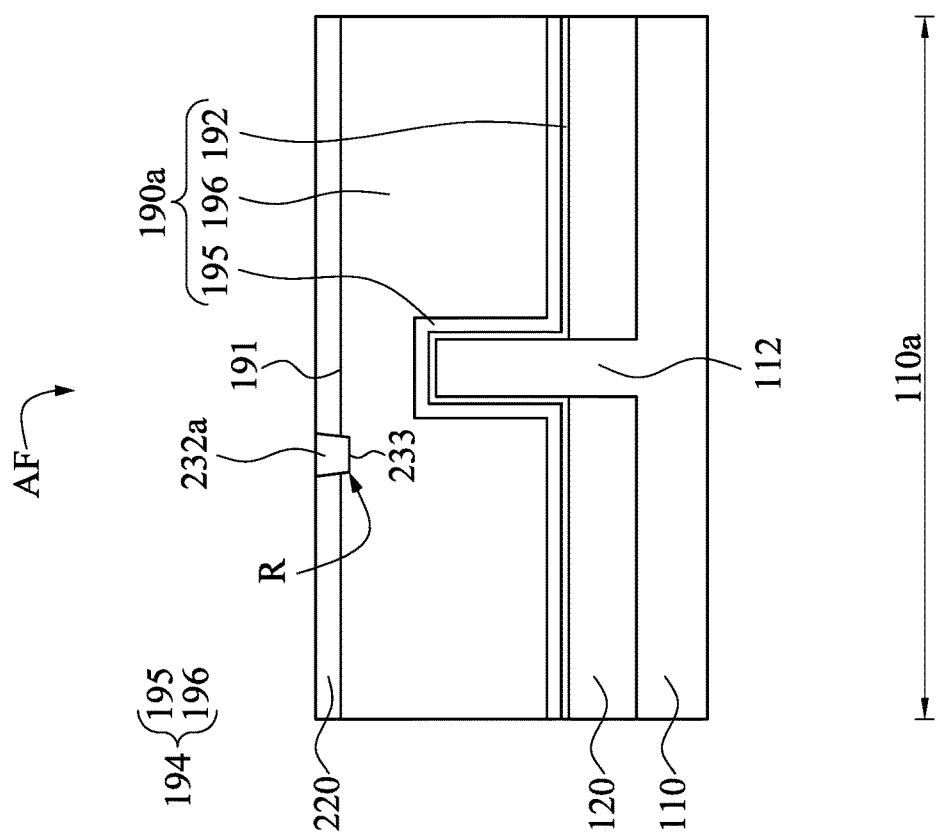

FIG. 8A is a top view of the memory cells C at some stages in accordance with some embodiments of the present disclosure, FIG. 8B is a cross-sectional view taking along line B-B of FIG. 8A, FIG. 8C is a cross-sectional view taking along line C-C of FIG. 8A, and FIG. 8D is a cross-sectional view taking along line D-D of FIG. 8A. A second ILD 220 is formed over the structure of FIGS. 7A-7D (i.e., over the first ILD 180, the metal gate structure 190a and 190b, and the contact 210). For clarity, in FIG. 8A, structures under the second ILD 220 are illustrated in solid lines. The second ILD 220 may be formed by chemical vapor deposition (CVD), high-density plasma CVD, spin-on, sputtering, or other suitable methods. In some embodiments, the second ILD 220 includes silicon oxide. In some other embodiments, the second ILD 220 may include silicon oxy-nitride, silicon nitride, or a low-k material.

Then, gate vias 232a, 232b and at least one S/D via 234 are formed in the second ILD 220. For example, a plurality of openings are formed in the second ILD 220, and the gate vias 232a, 232b and the S/D via 234 are respectively formed in the openings. In some embodiments, metal materials can be filled in the openings, and the excessive portions of the metal materials are removed by performing a CMP process to form the gate vias 232a, 232b and the S/D via 234. The gate vias 232a, 232b and the S/D via 234 can be made of copper, tungsten, aluminum, or other suitable materials. The gate via 232a is electrically connected to the metal gate structure 190a of the anti-fuse element AF, the gate via 232b is electrically connected to the metal gate structure 190b of the control transistor T, and the S/D via 234 is formed over the contact 210.

In some embodiments, the openings may be overetched, i.e., portions of the metal gate structures 190a and 190b may be etched, and at least one recess R is formed in the metal gate structure 190a and/or 190b. In some other embodiments, a cleaning process may be performed after the etching process, and the recess R may be further deepen during the cleaning process. In FIG. 8C, the gate via 232a is partially formed in the metal gate structure 190a. That is, a bottom surface 233 of the gate via 232a is lower than a top surface 191 of the metal gate structure 190a. In some other embodiments, the gate via 232b (see FIG. 8D) and/or the S/D via 234 may be partially formed in recesses R of the metal gate structure 190b and the contact 210.

Figure 9A:
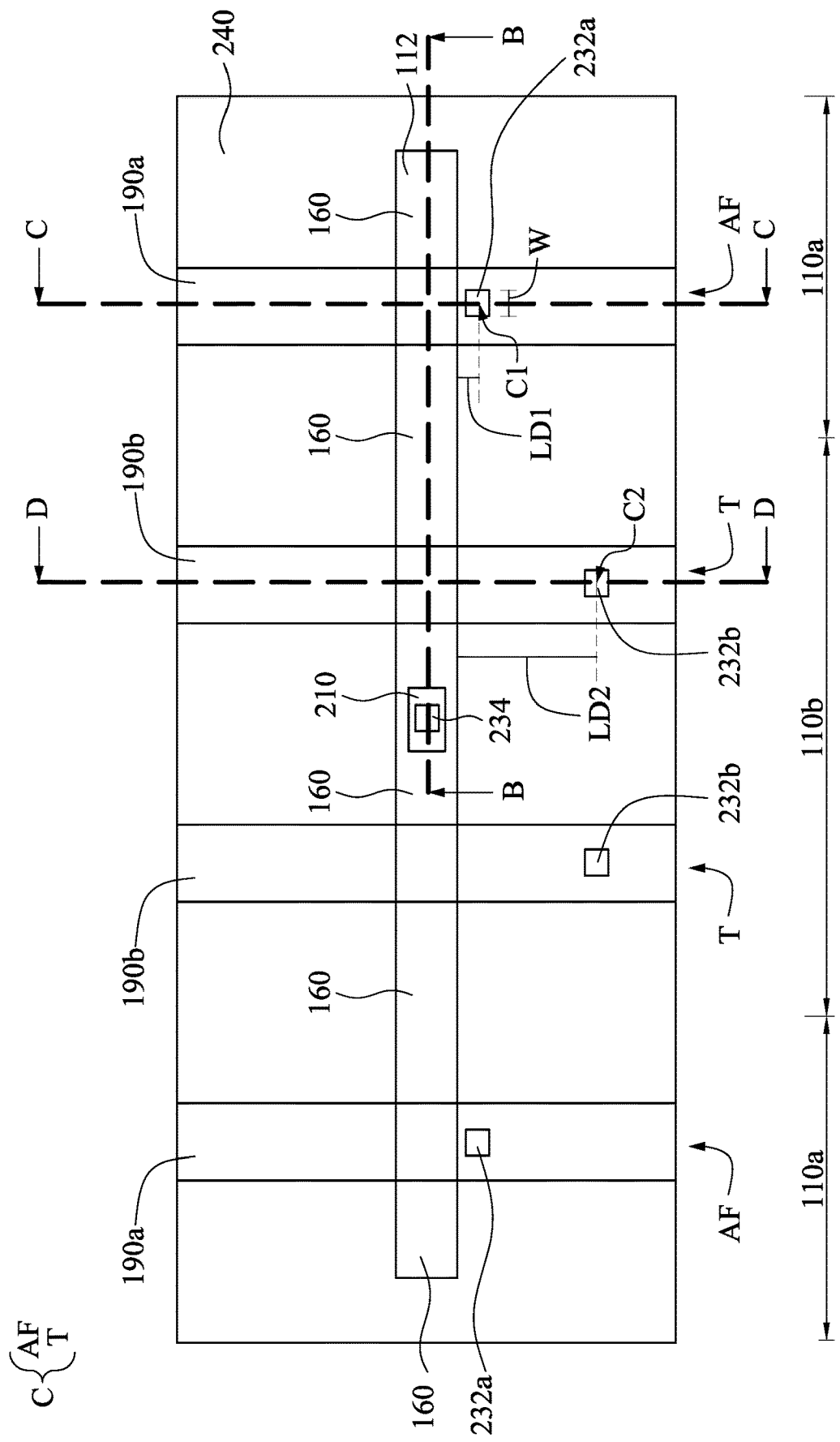
Figure 9B:
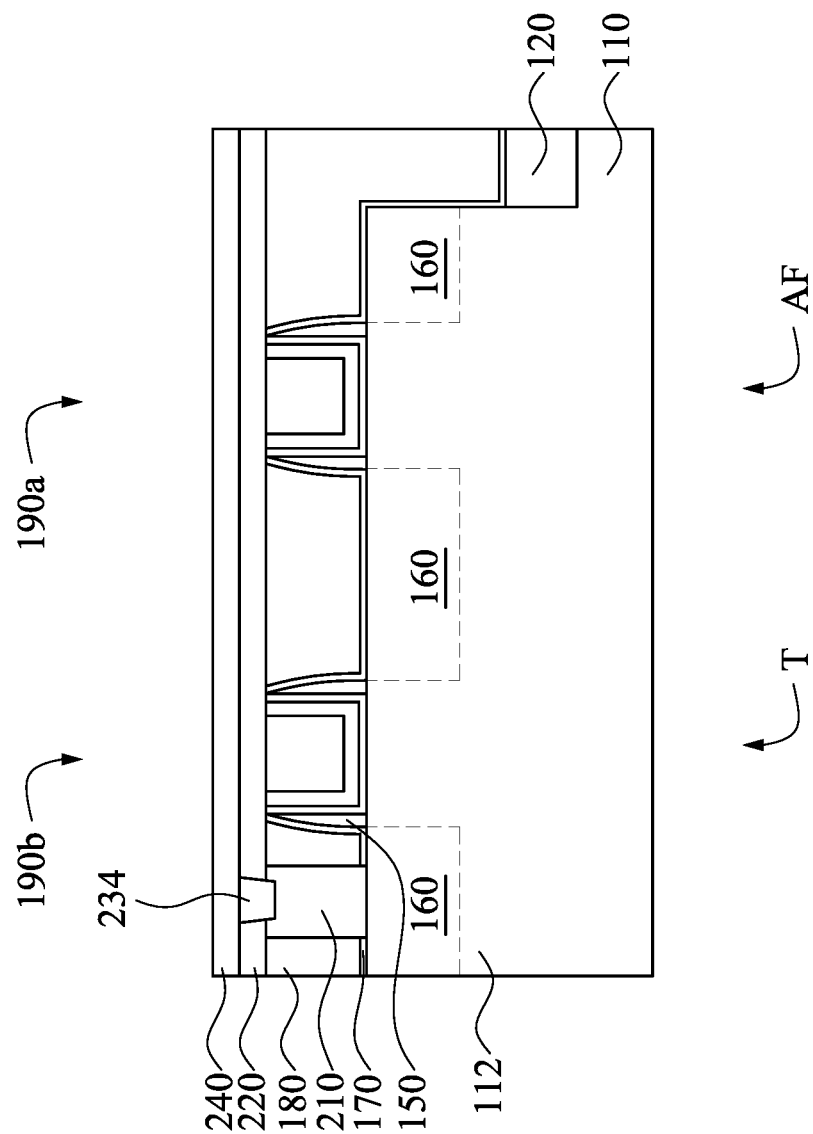
Figure 9D:
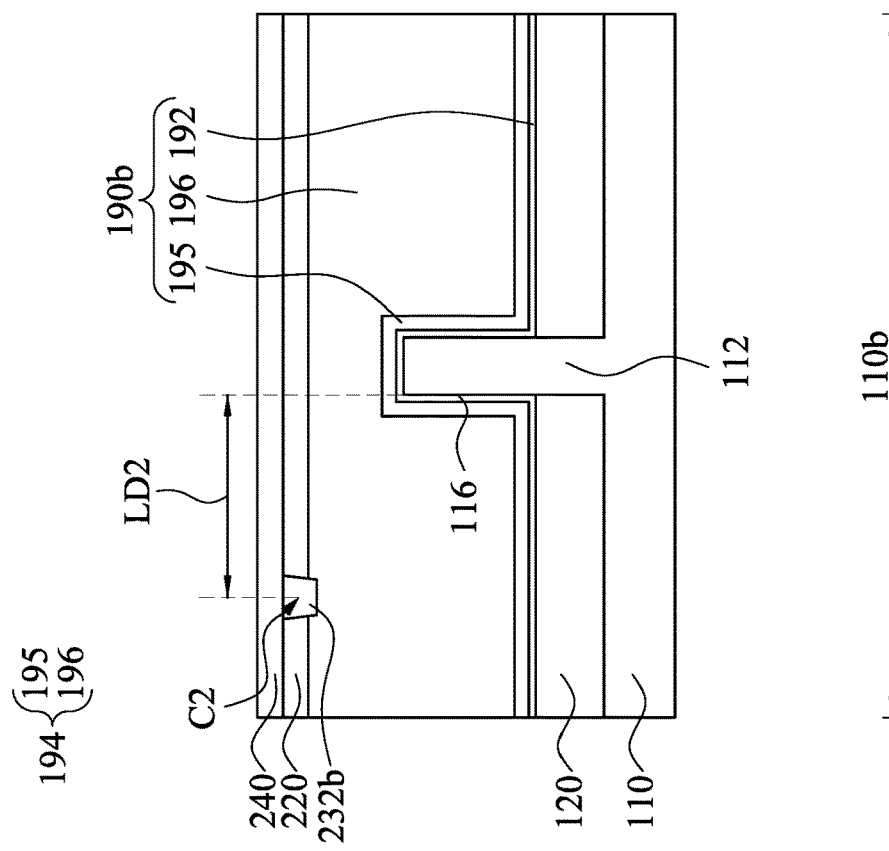
Figure 9C:
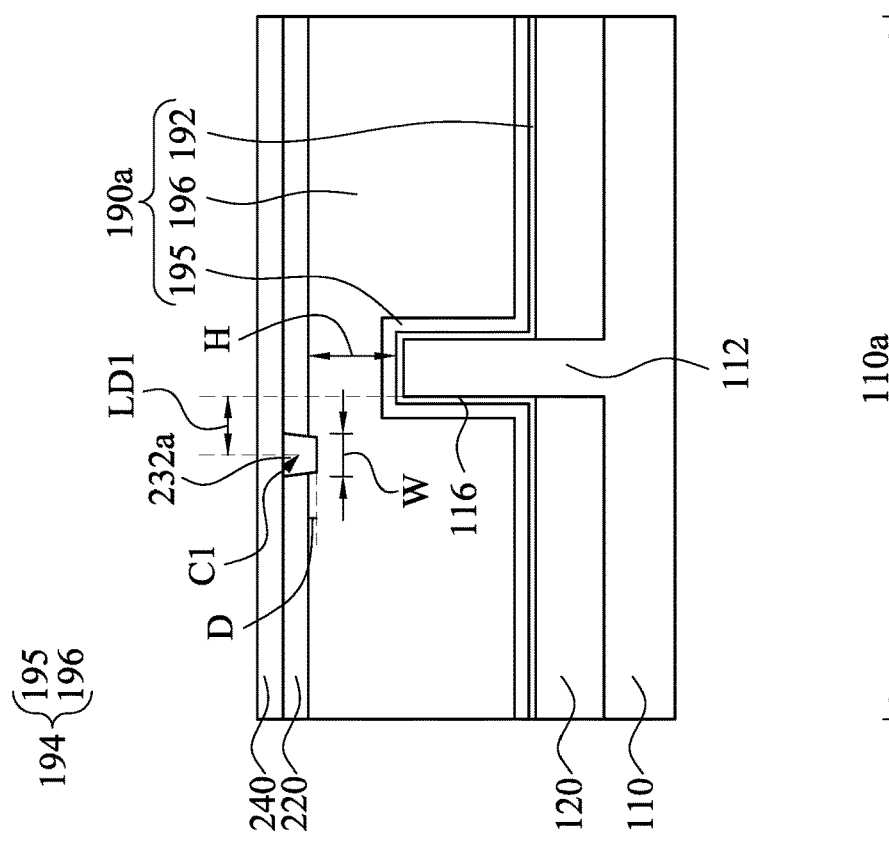

FIG. 9A is a top view of the memory cells C at some stages in accordance with some embodiments of the present disclosure, FIG. 9B is a cross-sectional view taking along line B-B of FIG. 9A, FIG. 9C is a cross-sectional view taking along line C-C of FIG. 9A, and FIG. 9D is a cross-sectional view taking along line D-D of FIG. 9A. An inter-metal dielectric (IMD) layer 240 is formed to interconnect the anti-fuse element AF and the control transistor T, as shown in FIGS. 9A-9D. For clarity, in FIG. 9A, structures under the IMD layer 240 are illustrated in solid lines, and the route design in the IMD 240 is omitted in FIG. 9A. The conductive features in the IMD 240 (e.g., the bit line BL, the programming lines PG, and the word lines WL) are shown in FIG. 1A. The IMD layer 240 may provide electrical interconnection between the anti-fuse element AF and the control transistor T as well as structural support for the various features of structures formed thereon during many fabrication process operations. In some embodiments, the IMD layer 240 may be silicon oxide, low-k silicon oxide such as a porous silicon oxide layer, other suitable interlayer dielectric (ILD) material, other suitable inter-metal dielectric material, combinations thereof, or the like. In some embodiments, the IMD layer 240 is a low-k dielectric layer made from extra low-k materials, extreme low-k materials, combinations thereof, or the like. In some embodiments, the IMD layer 240 may have a dielectric constant lower than 2.4. In some embodiments, the IMD layer 240 is made using diethoxymethylsilane (mDEOS) or the like as a precursor gas in a chemical vapor deposition (CVD) process. However, other low-k dielectric materials may be used as well. The IMD layer 240 also includes conductive elements for interconnecting the anti-fuse element AF and the control transistor T. In some embodiments, the IMD layer 240 includes multiple layers (MO to Mn layers).

Reference is made to FIGS. 9A and 1A. For example, the IMD layer 240 includes at least one bit line BL substantially parallel to the semiconductor fin 112 and substantially perpendicular to the metal gate structures 190a and 190b. The bit line BL is coupled to the contact 210 through the S/D via 234, such that the bit line BL is electrically connected to the shared source/drain region 160 of the symmetric control transistors T. The IMD layer 240 may further include a plurality of programming lines PG substantially parallel to the metal gate structures 190a and 190b and substantially perpendicular to the semiconductor fin 112. The programming line PG is coupled to the metal gate structure 190a through the gate via 232a, such that the programming line PG is electrically connected to the metal gate structure 190a of the anti-fuse element AF. The IMD layer 240 may further include a plurality of word lines WL substantially parallel to the metal gate structures 190a and 190b and substantially perpendicular to the semiconductor fin 112. The word line WL is coupled to the metal gate structure 190b through the gate via 232b, such that the word line WL is electrically connected to the metal gate structure 190b of the control transistor T. In some embodiments, the programming lines PG and the word lines WL may be formed in the same layer, and the bit lines BL and the programming lines PG (and the word lines WL) may be formed in different layers. For example, the bit lines BL may be formed above or below the programming lines PG and the word lines WL.

The anti-fuse element AF is at a high-resistance state before being programmed. When the programming is performed, a power source, which may be a voltage source, applies a programming voltage to the programming line PG. During the programming, the gate dielectric layer 192 of the metal gate structure 190a may be broken down. Accordingly, the programming turns the anti-fuse element AF from a high-resistance state to a low-resistance state. The resistance of the anti-fuse element AF may be measured from the gate via 232a to the source/drain region 160.

In FIG. 9C, the metal gate electrode 194 has a (minimum) height H, which is measured from a top surface of the metal gate electrode 194 to a portion of the gate dielectric layer 192 on a top of the semiconductor fin 112. The gate via 232a has a depth D in the metal gate electrode 194 (i.e., the depth of the recess R). A ratio of the height H to depth D is in a range between about 3 and about 15. If the ratio is less than about 3, the anti-fuse element AF is easy to be programed, and the states "0" and "1" may not be distinguishable; if the ratio is greater than about 15, the anti-fuse element AF may exist two different breakdown modes (the fin-top mode and the fin-sidewall mode), which may lower the reliability of the memory device.

In FIGS. 9A and 9C, the gate via 232a has a width W, and a center C1 of the gate via 232a and a sidewall 116 of the semiconductor fin 112 has a lateral distance LD1 less than or equal to the width W. In some embodiments, the center C1 of the gate via 232a is a centroid of the gate via 232a. In FIGS. 9A and 9C, the gate via 232a is misaligned with the semiconductor fin 112. If the lateral distance LD1 is greater than the width W (e.g., the gate via 232a is too far from the semiconductor fin 112), the anti-fuse element AF may exist two different breakdown modes.

In FIGS. 9A and 9D, a center C2 of the gate via 232b and the sidewall 116 of the semiconductor fin 112 has a lateral distance LD2 greater than the lateral distance LD1 between the gate via 232a and the sidewall 116 of the semiconductor fin 112 (see FIG. 9C). In some embodiments, the center C2 of the gate via 232b is a centroid of the gate via 232b. The breakdown voltage of a device (e.g., the anti-fuse element AF and/or the control transistor T in this case) depends on the lateral distance (i.e., LD1 and/or LD2). That is, the shorter the lateral distance, the lower the breakdown voltage. In FIG. 9A, since the lateral distance LD1 is shorter than the lateral distance LD2, it's easier to breakdown the anti-fuse element AF rather than the control transistor T. With such configuration, the control transistor T can provide high voltage to the anti-fuse element AF to program the anti-fuse element AF without being broken-down itself.

Figure 10:
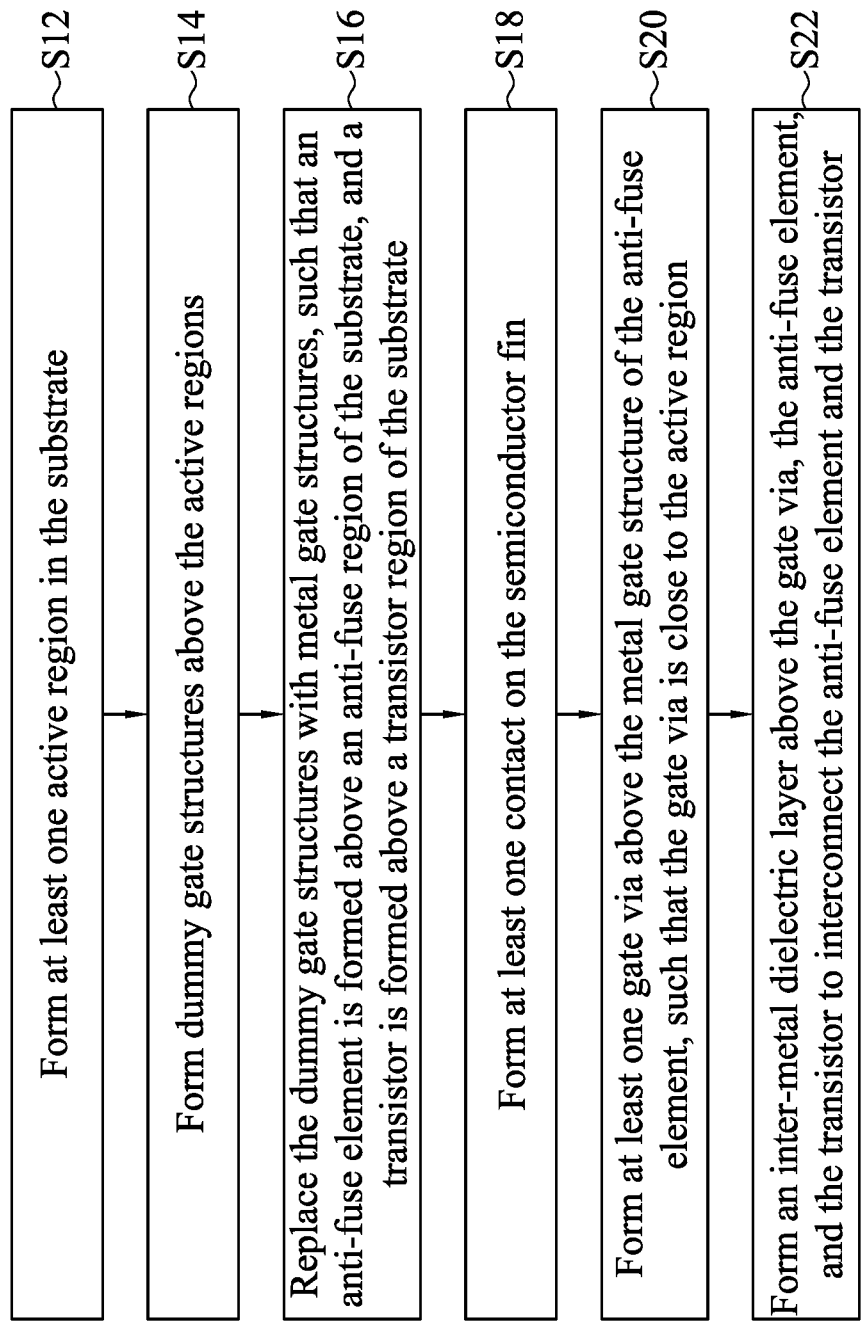
FIG. 10 is a flow chart of a method for forming a memory device in accordance with some embodiments of the present disclosure.

FIG. 10 is a flow chart of a method M for forming a memory device in accordance with some embodiments of the present disclosure. Although the method M is illustrated and/or described as a series of acts or events, it will be appreciated that the method is not limited to the illustrated ordering or acts. Thus, in some embodiments, the acts may be carried out in different orders than illustrated, and/or may be carried out concurrently. Further, in some embodiments, the illustrated acts or events may be subdivided into multiple acts or events, which may be carried out at separate times or concurrently with other acts or sub-acts. In some embodiments, some illustrated acts or events may be omitted, and other un-illustrated acts or events may be included.

Figure 2B:
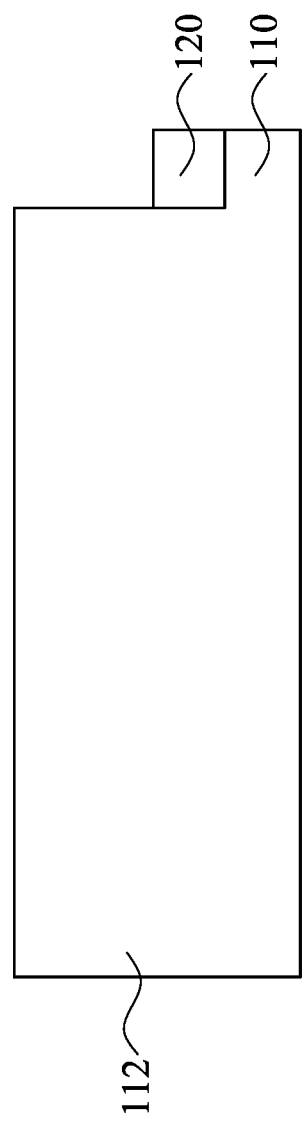
Figure 2C:
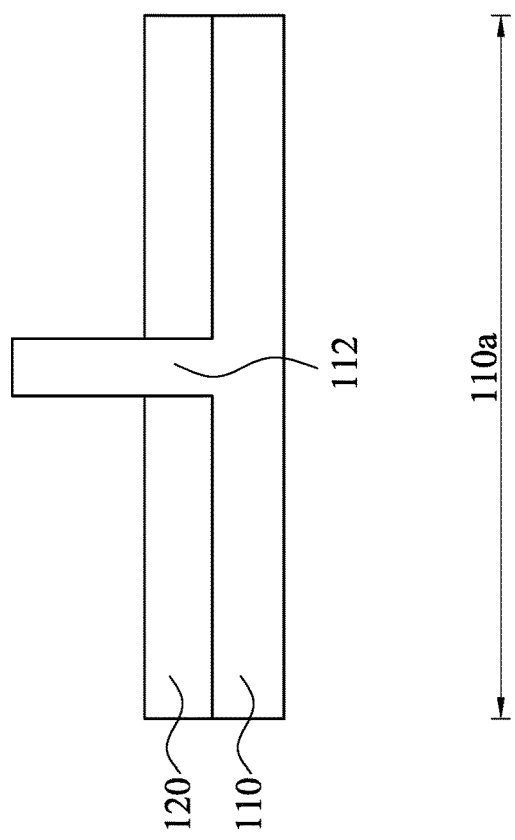
Figure 2D:
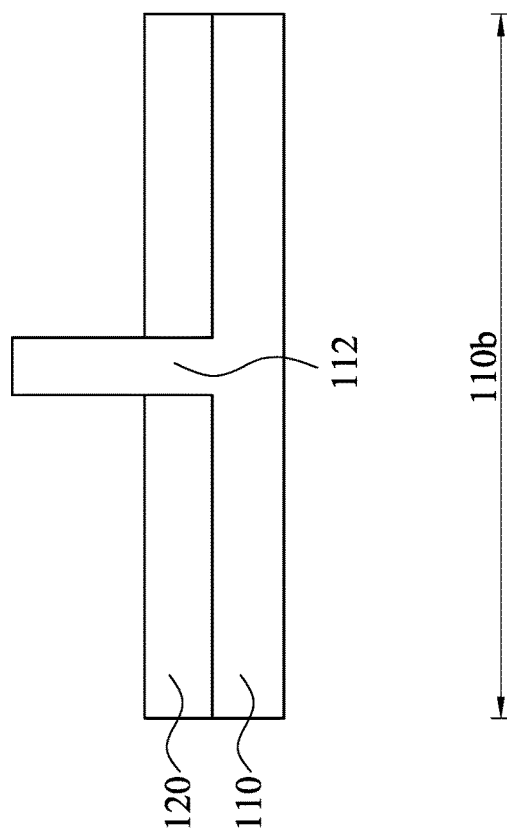

At block S12, at least one active region is formed in the substrate. In some embodiments, the active region may be a semiconductor fin. FIGS. 2A-2C illustrate top views and cross-sectional views of some embodiments corresponding to act in block S12. At block S14, dummy gate structures are formed above the active regions. FIGS. 3A-3C illustrate top views and cross-sectional views of some embodiments corresponding to act in block S14. At block S16, the dummy gate structures are replaced with metal gate structures, such that an anti-fuse element is formed above an anti-fuse region of the substrate, and a transistor is formed above a transistor region of the substrate. FIGS. 6A-6C illustrate top views and cross-sectional views of some embodiments corresponding to act in block S16. At block S18, at least one contact is formed on the semiconductor fin. FIGS. 7A-7C illustrate top views and cross-sectional views of some embodiments corresponding to act in block S18. At block S20, at least one gate via is formed above the metal gate structure of the anti-fuse element, such that the gate via is close to the active region. FIGS. 8A-8C illustrate top views and cross-sectional views of some embodiments corresponding to act in block S20. At block S22, an inter-metal dielectric layer is formed above the gate via, the anti-fuse element, and the control transistor to interconnect the anti-fuse element and the transistor. FIGS. 9A-9C illustrate top views and cross-sectional views of some embodiments corresponding to act in block S22.

Figure 11B:
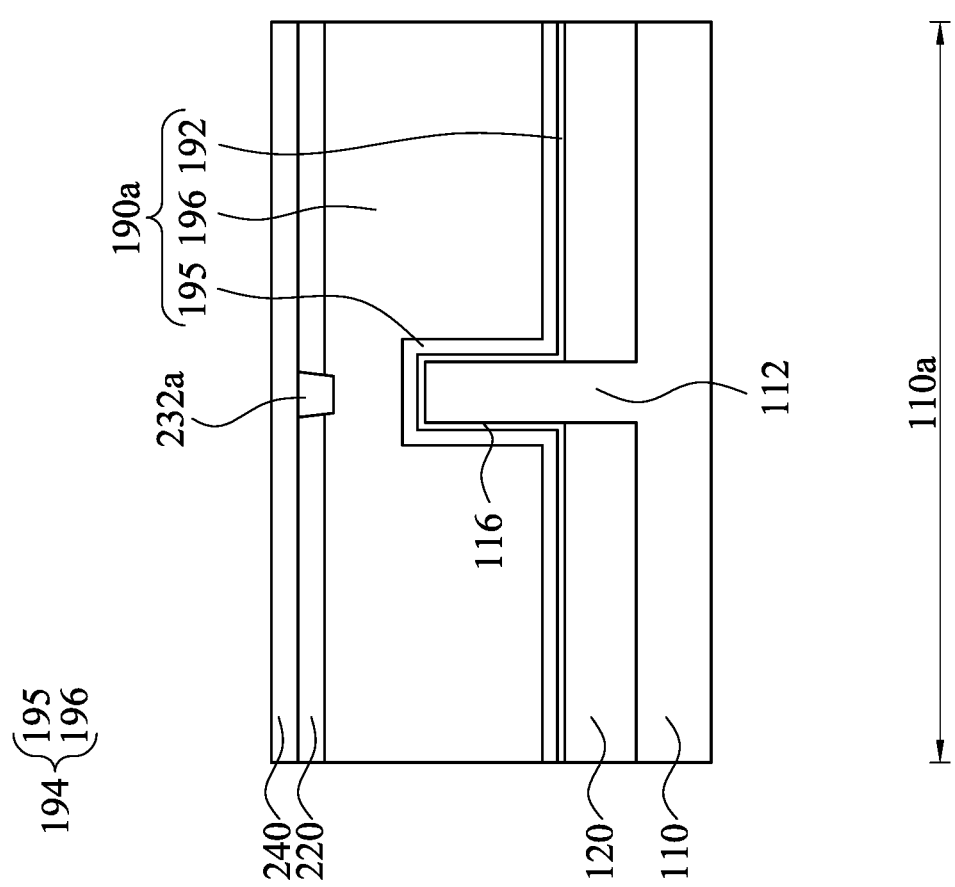
FIG. 11B is a cross-sectional view taking along line B-B of FIG. 11A.

FIG. 11A is a top view of the memory cells C in accordance with some embodiments of the present disclosure, and FIG. 11B is a cross-sectional view taking along line B-B of FIG. 11A. The difference between the memory cells C in FIGS. 11A-11B and FIGS. 9A-9D pertains to the position of the gate via 232a. In FIGS. 11A and 11B, the gate via 232a is right above the semiconductor fin 112. That is, the gate via 232a overlaps with the semiconductor fin 112 in the top view (as shown in FIG. 11A). Other relevant structural details of the memory cells C in FIGS. 11A and 11B are similar to the memory cells C in FIGS. 9A-9C, and, therefore, a description in this regard will not be repeated hereinafter. For example, a ratio of the minimum height of the metal gate electrode 194 to the depth of the gate via 232a in the metal gate electrode 194 is in a range between about 3 and about 15.

Figure 12A:
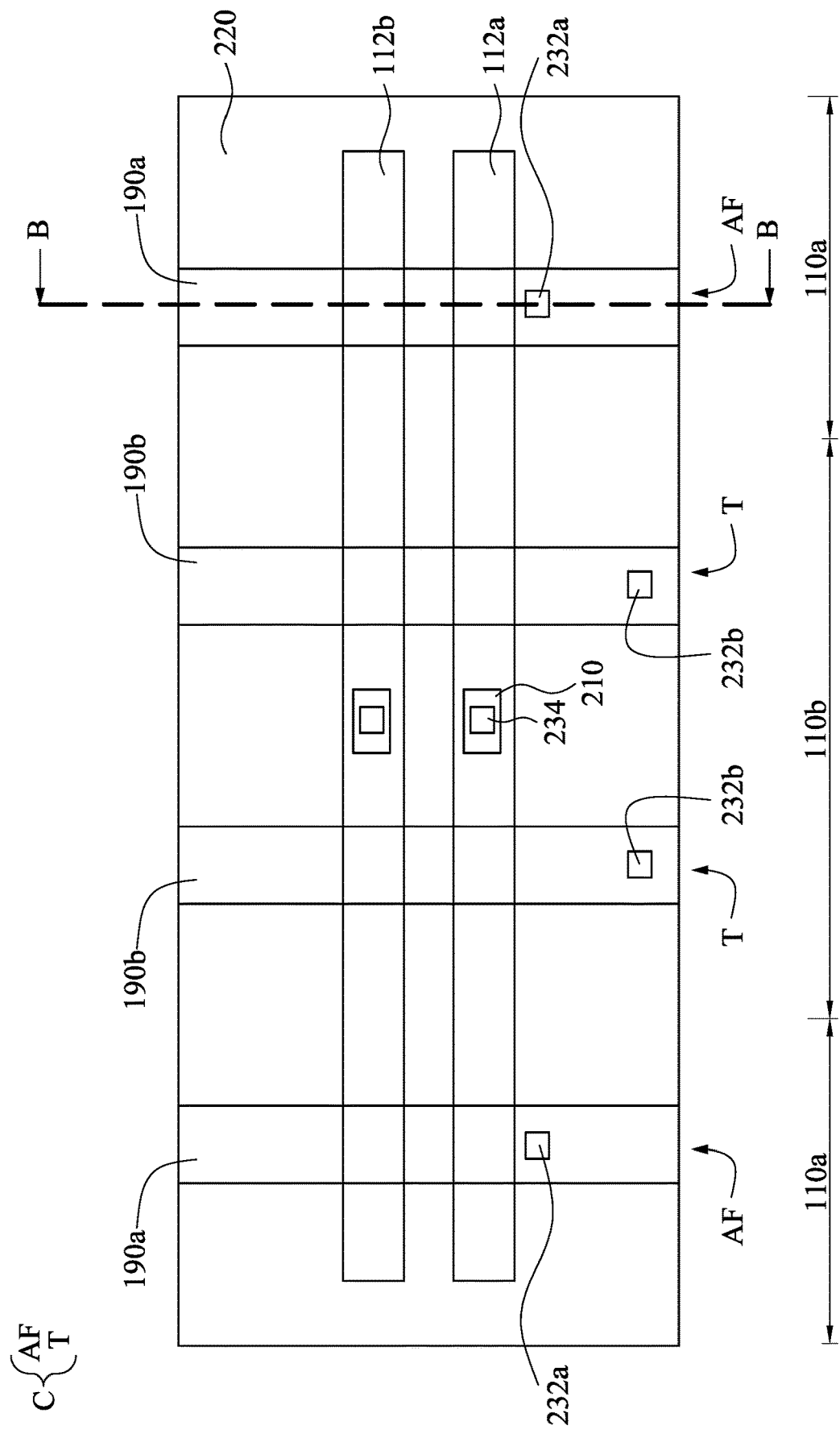
FIG. 12A is a top view of the memory cells in accordance with some embodiments of the present disclosure.
Figure 12B:
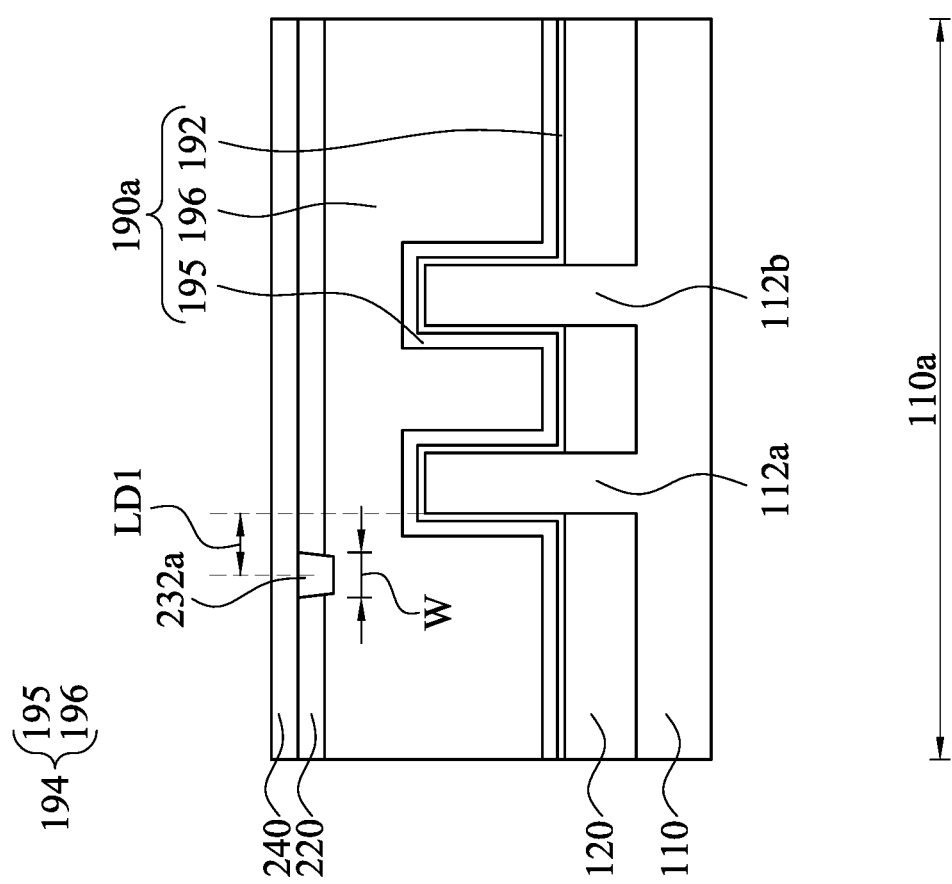
FIG. 12B is a cross-sectional view taking along line B-B of FIG. 12A.

FIG. 12A is a top view of the memory cells C in accordance with some embodiments of the present disclosure, and FIG. 12B is a cross-sectional view taking along line B-B of FIG. 12A. The difference between the memory cells C in FIGS. 12A-12B and FIGS. 9A-9D pertains to the number of the semiconductor fin(s). In FIGS. 12A and 12B, the anti-fuse element AF includes a first semiconductor fin 112a and a second semiconductor fin 112b. The first semiconductor fin 112a is between the gate via 232a and the second semiconductor fin 112b. The gate via 232a is close to the first semiconductor fin 112a. The lateral distance LD1 between the gate via 232a and the first semiconductor fin 112a is less than or equal to the width W of the gate via 232a. Other relevant structural details of the memory cells C in FIGS. 12A and 12B are similar to the memory cells C in FIGS. 9A-9D, and, therefore, a description in this regard will not be repeated hereinafter. For example, a ratio of the minimum height of the metal gate electrode 194 to the depth of the gate via 232a in the metal gate electrode 194 is in a range between about 3 and about 15.

Figure 13A:
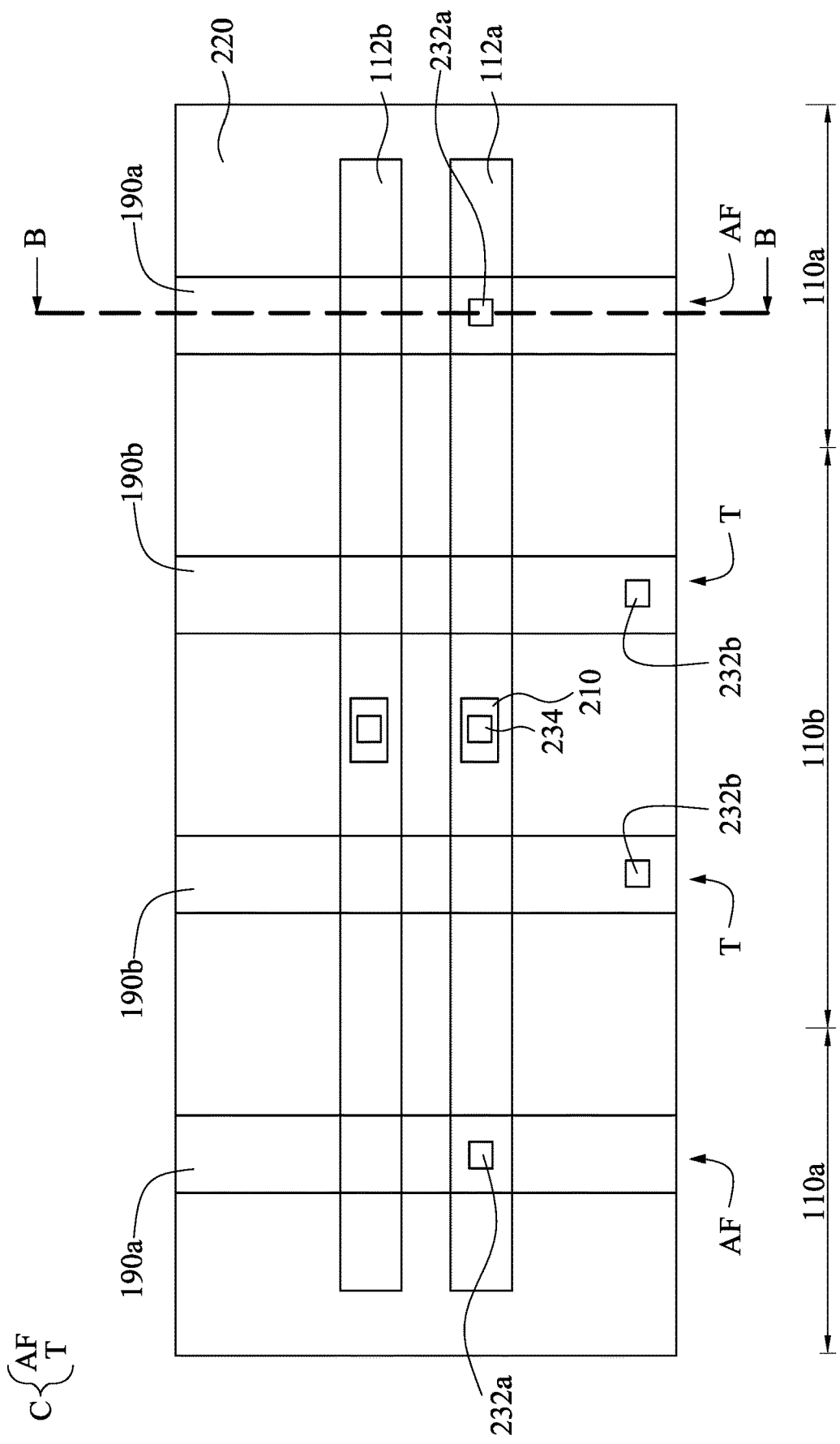
FIG. 13A is a top view of the memory cells in accordance with some embodiments of the present disclosure.
Figure 13B:
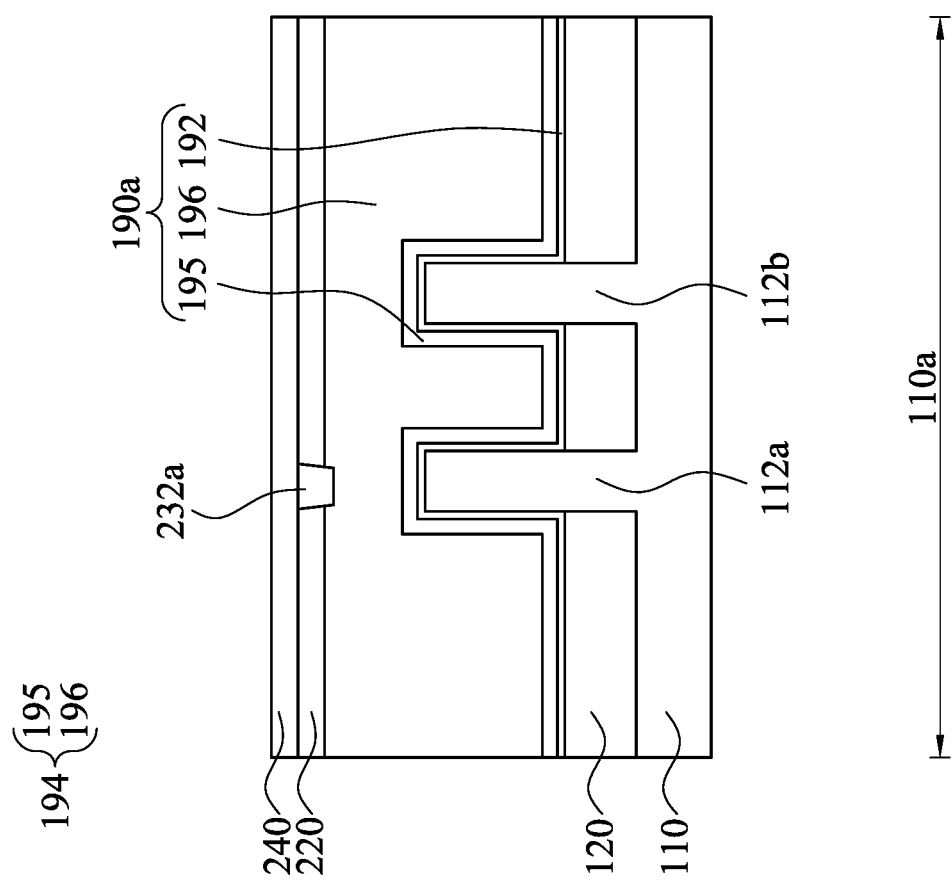
FIG. 13B is a cross-sectional view taking along line B-B of FIG. 13A.

FIG. 13A is a top view of the memory cells C in accordance with some embodiments of the present disclosure, and FIG. 13B is a cross-sectional view taking along line B-B of FIG. 13A. The difference between the memory cells C in FIGS. 13A-13B and FIGS. 12A-12B pertains to the position of the gate via 232a. In FIGS. 13A and 13B, the gate via 232a is right above the first semiconductor fin 112a. That is, the via 232a overlaps with the semiconductor fin 112a in a top view (as shown in FIG. 13A). Other relevant structural details of the memory cells C in FIGS. 13A and 13B are similar to the memory cells C in FIGS. 12A-12B, and, therefore, a description in this regard will not be repeated hereinafter. For example, a ratio of the minimum height of the metal gate electrode 194 to the depth of the gate via 232a in the metal gate electrode 194 is in a range between about 3 and about 15.

Figure 14A:
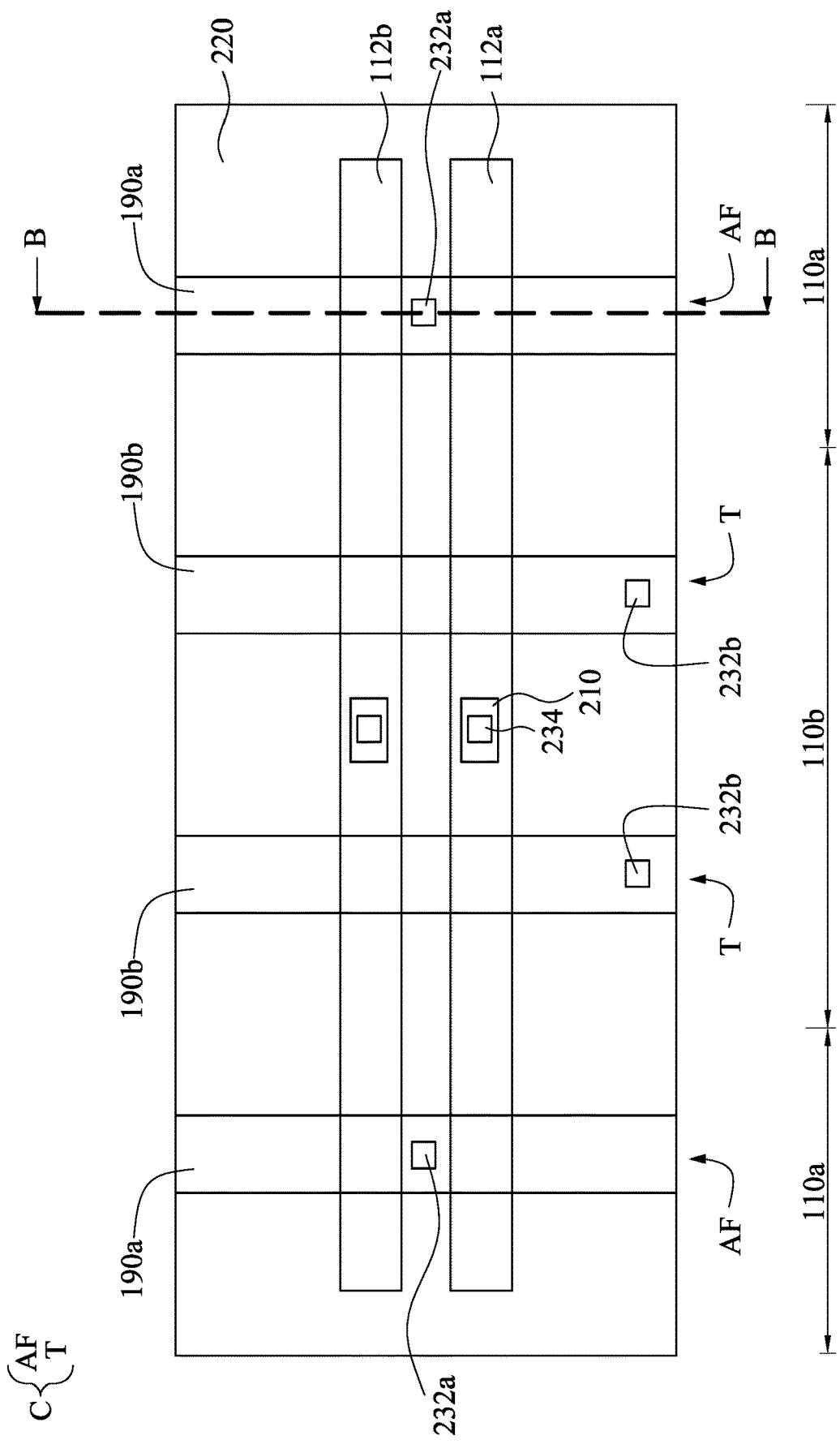
FIG. 14A is a top view of the memory cells in accordance with some embodiments of the present disclosure.
Figure 14B:
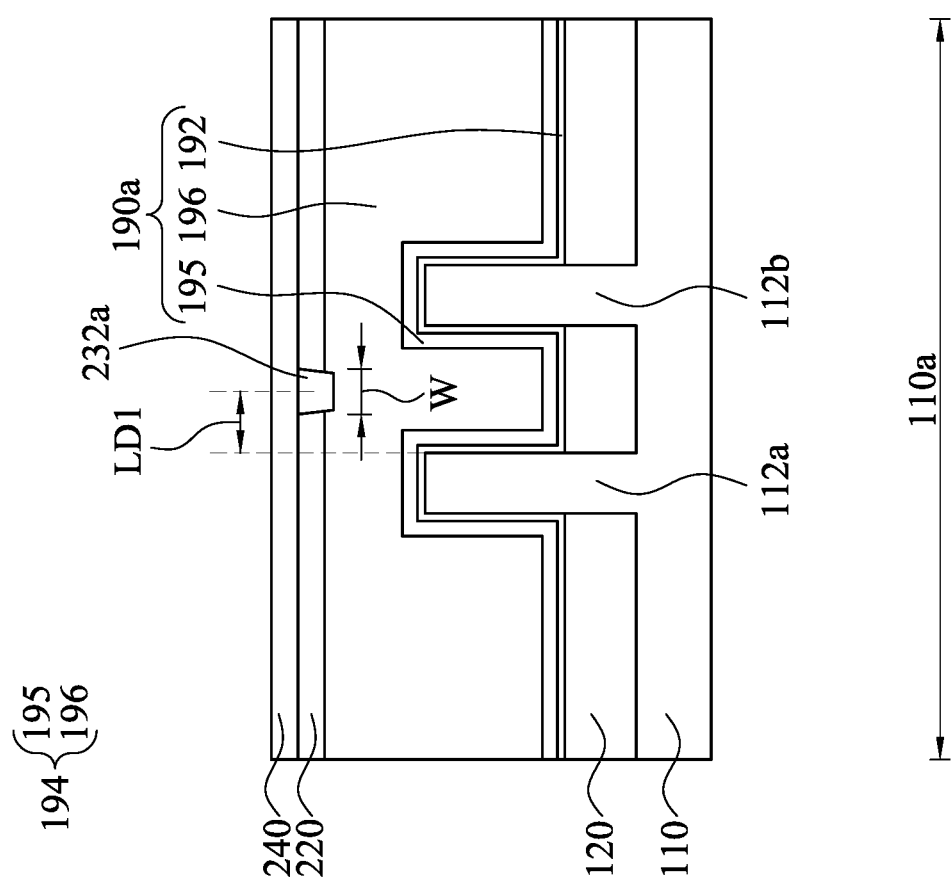
FIG. 14B is a cross-sectional view taking along line B-B of FIG. 14A.

FIG. 14A is a top view of the memory cells C in accordance with some embodiments of the present disclosure, and FIG. 14B is a cross-sectional view taking along line B-B of FIG. 14A. The difference between the memory cells C in FIGS. 14A-14B and FIGS. 12A-12B pertains to the position of the gate via 232a. In FIGS. 14A and 14B, the gate via 232a is between the first semiconductor fin 112a and the second semiconductor fin 112b. In some embodiments, a lateral distance between the gate via 232a and the first semiconductor fin 112a is substantially equal to a lateral distance between the gate via 232a and the second semiconductor fin 112b. In some other embodiments, the lateral distance between the gate via 232a and the first semiconductor fin 112a is greater than the lateral distance between the gate via 232a and the second semiconductor fin 112b. In still some other embodiments, the lateral distance between the gate via 232a and the first semiconductor fin 112a is less than the lateral distance between the gate via 232a and the second semiconductor fin 112b. Further, the lateral distance LD1 between the gate via 232a and the first semiconductor fin 112a (or the second semiconductor fin 112b) may be less than or equal to the width W of the gate via 232a. Other relevant structural details of the memory cells C in FIGS. 14A and 14B are similar to the memory cells C in FIGS. 12A-12B, and, therefore, a description in this regard will not be repeated hereinafter. For example, a ratio of the minimum height of the metal gate electrode 194 to the depth of the gate via 232a in the metal gate electrode 194 is in a range between about 3 and about 15.

Figure 15A:
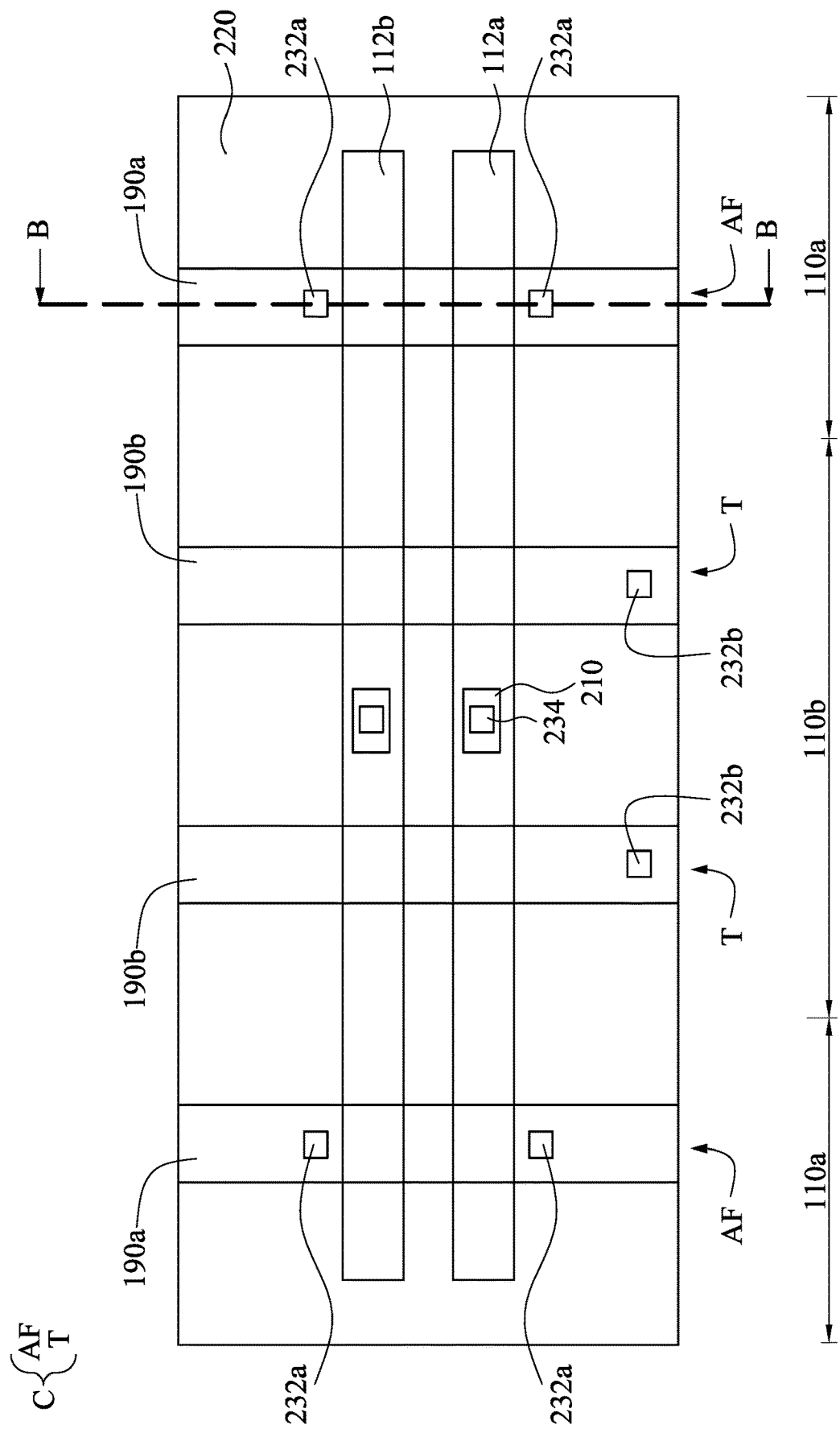
FIG. 15A is a top view of the memory cells in accordance with some embodiments of the present disclosure.
Figure 15B:
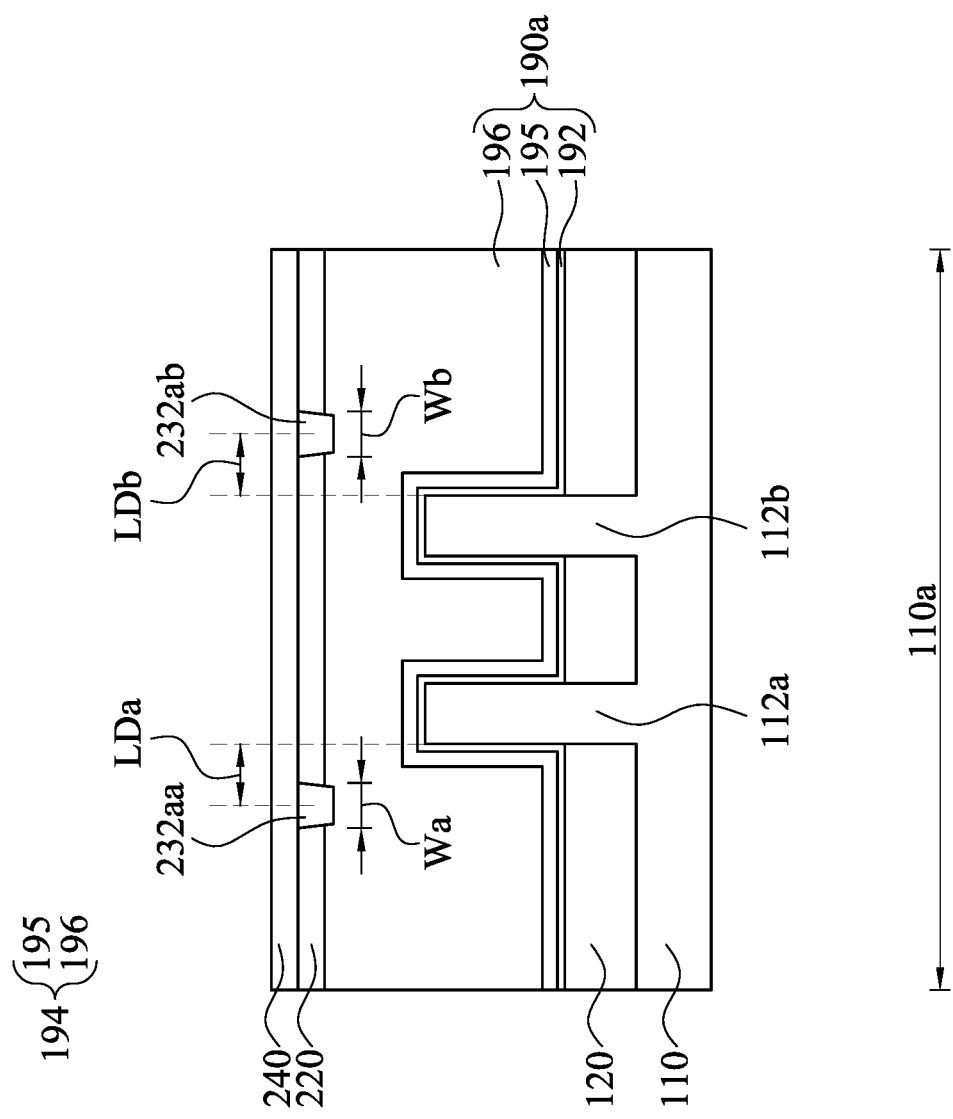
FIG. 15B is a cross-sectional view taking along line B-B of FIG. 15A.

FIG. 15A is a top view of the memory cells C in accordance with some embodiments of the present disclosure, and FIG. 15B is a cross-sectional view taking along line B-B of FIG. 15A. The difference between the memory cells C in FIGS. 15A-15B and FIGS. 12A-12B pertains to the number of the gate vias. In FIGS. 15A and 15B, the first semiconductor fin 112a is between the gate via 232aa and the second semiconductor fin 112b, and the second semiconductor fin 112b is between the gate via 232ab and the first semiconductor fin 112a. The gate via 232aa is close to the first semiconductor fin 112a, and the gate via 232ab is close to the second semiconductor fin 112b. The lateral distance LDa between the gate via 232aa and the first semiconductor fin 112a is less than or equal to the width Wa of the gate via 232aa, and the lateral distance LDb between the gate via 232ab and the second semiconductor fin 112b is less than or equal to the width Wb of the gate via 232ab. Other relevant structural details of the memory cells C in FIGS. 15A and 15B are similar to the memory cells C in FIGS. 12A-12B, and, therefore, a description in this regard will not be repeated hereinafter. For example, a ratio of the minimum height of the metal gate electrode 194 to the depth of the gate via 232aa (or the gate via 232ab) in the metal gate electrode 194 is in a range between about 3 and about 15.

Figure 16:
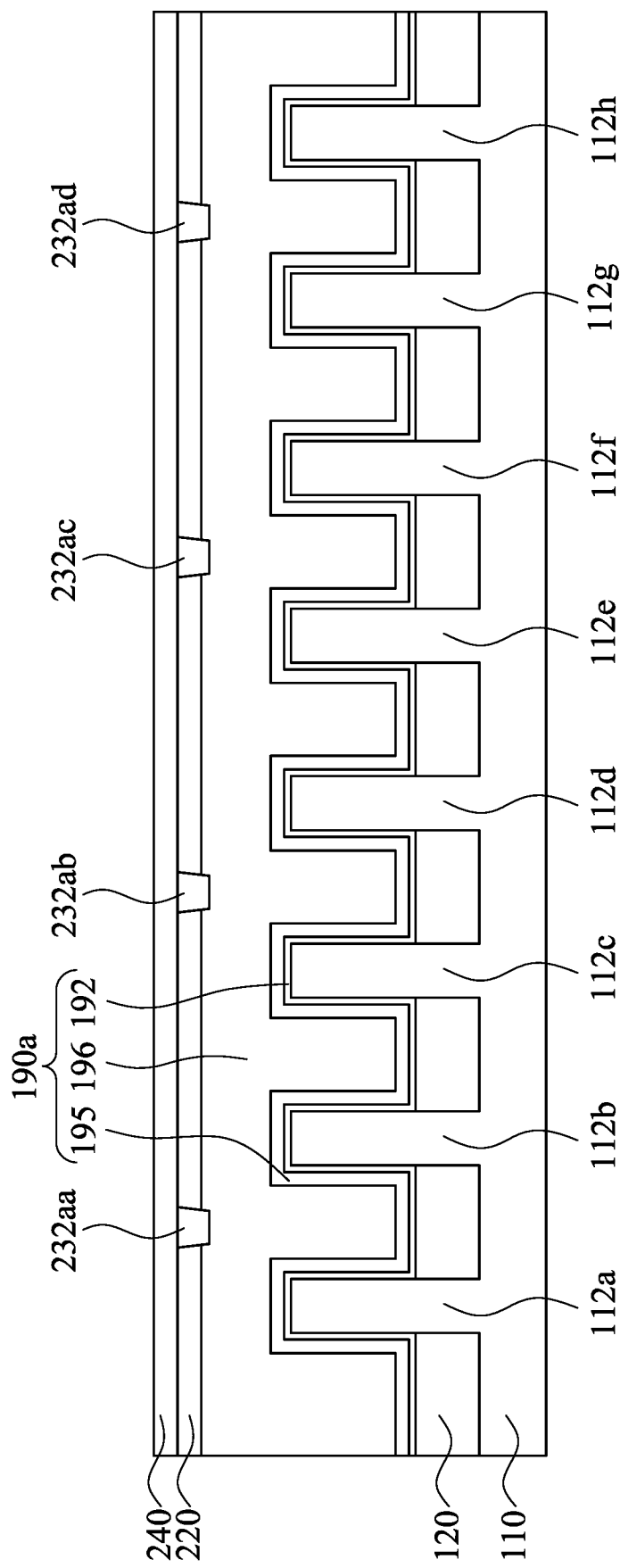
FIG. 16 is a cross-sectional view of the memory cells in accordance with some embodiments of the present disclosure.

FIG. 16 is a cross-sectional view of the memory cells C in accordance with some embodiments of the present disclosure. The difference between the memory cells C in FIGS. 16 and 15B pertains to the number of the gate vias and the number of the semiconductor fins. In FIG. 16, the anti-fuse element AF includes eight semiconductor fins 112a, 112b, 112c, 112d, 112e, 113f, 112g, and 112h. The metal gate structure 190a covers the semiconductor fins 112a-112h. Further, the memory cell C includes four gate vias 232aa, 232ab, 232ac, and 232ad. The gate vias 232aa is between the semiconductor fins 112a and 112b, such that a conductive path may be formed between the gate vias 232aa and the semiconductor fins 112a and/or 112b after programming. The gate vias 232ab is between the semiconductor fins 112c and 112d, such that a conductive path may be formed between the gate vias 232ab and the semiconductor fins 112c and/or 112d after programming. The gate vias 232ac is between the semiconductor fins 112e and 112f, such that a conductive path may be formed between the gate vias 232ac and the semiconductor fins 112e and/or 112f after programming. The gate vias 232ad is between the semiconductor fins 112g and 112h, such that a conductive path may be formed between the gate vias 232ad and the semiconductor fins 112g and/or 112h after programming. Other relevant structural details of the memory cells C in FIG. 16 are similar to the memory cells C in FIGS. 15A-15B, and, therefore, a description in this regard will not be repeated hereinafter. For example, a ratio of the minimum height of the metal gate electrode 194 to the depth of the gate via 232aa (or 232ab or 232ac or 232ad) in the metal gate electrode 194 is in a range between about 3 and about 15.

It is noted that the numbers of the semiconductor fins of the anti-fuse elements mentioned above are illustrative, and should not limit the present disclosure. In some embodiments, the number of the semiconductor fins of the anti-fuse elements may be one or greater than one. In some other embodiments, the number of the semiconductor fins of the anti-fuse elements may be 1 to 8. If the number of the semiconductor fins of the anti-fuse element is greater than one, the anti-fuse element may be a multi-level anti-fuse element.

Based on the above discussions, it can be seen that the present disclosure offers advantages. It is understood, however, that other embodiments may offer additional advantages, and not all advantages are necessarily disclosed herein, and that no particular advantages are required for all embodiments. One advantage is that the anti-fuse element has a single breakdown mode (i.e., the fin-top mode) since the position design of the corresponding gate via. As such, the improved OTP devices have a well-known controlled cell characterization and good quality (reliability). Furthermore, the improved vertical distance between the gate via and the semiconductor fin provides good programming condition. Another advantage is that the improvement of the gate via does not complicate the manufacturing process for forming the semiconductor device.

According to some embodiments, a memory device includes a transistor, an anti-fuse element, a gate via, and a bit line. The transistor includes two source/drain regions. The anti-fuse element is connected to one of the source/drain regions of the transistor. The anti-fuse element includes a channel and a gate structure above the channel. The gate via is above the gate structure of the anti-fuse element. A lateral distance between a center of the gate via and a sidewall of the channel is less than a width of the gate via. The bit line is connected to another of the source/drain regions of the transistor.

According to some embodiments, a memory device includes a transistor, an anti-fuse element, a first gate via, and a second gate via. The transistor includes a first channel and a first gate structure above the first channel. The anti-fuse element is connected to the transistor in series. The anti-fuse element includes a second channel and a second gate structure above the second channel. The first gate via is above the first gate structure of the transistor. A first lateral distance is formed between a center of the first gate via and a sidewall of the first channel. The second gate via is above the second gate structure of the anti-fuse element. A second lateral distance is formed between a center of the second gate via and a sidewall of the second channel, and the first lateral distance is greater than the second lateral distance.

According to some embodiments, a method for manufacturing a memory device includes forming an active region in a substrate. A first gate structure and a second gate structure are formed above the active region, such that the first gate structure and the active region form a transistor, and the second gate structure and the active region form an anti-fuse element. A gate via is formed above the second gate structure, such that a lateral distance between a center of the gate via and a side of the active region is less than a width of the gate via. A bit line is formed to electrically connect to a source/drain region of the transistor.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A memory device comprising:
   a transistor comprising a fin structure and a first gate structure across the fin structure;
   an anti-fuse element comprising the fin structure and a second gate structure across the fin structure;
   a first gate via connected to the first gate structure of the transistor and spaced apart from the fin structure in a top view;
   a second gate via connected to the second gate structure of the anti-fuse element and directly above the fin structure; and
   a bit line connected to the fin structure and the transistor.

2. The memory device of claim 1, wherein a portion of the second gate via is embedded in the second gate structure.

3. The memory device of claim 2, wherein a gate electrode of the second gate structure has a minimum height, the portion of the second gate via embedded in the second gate structure has a depth, and a ratio of the minimum height to the depth is in a range of about 3 and about 15.

4. The memory device of claim 1, wherein the transistor is between the anti-fuse element and the bit line.

5. The memory device of claim 1, further comprising a source/drain via connected to the bit line.

6. The memory device of claim 5, wherein the source/drain via is aligned with the second gate via and is misaligned with the first gate via in the top view.

7. The memory device of claim 1, further comprising a word line electrically connected to the first gate structure of the transistor.

8. The memory device of claim 7, further comprising a programming line electrically connected to the second gate structure of the anti-fuse element.

9. The memory device of claim 8, wherein the word line and the programming line extend in substantially the same direction.

10. The memory device of claim 7, wherein the word line and the bit line extend in different directions.

11. A memory device comprising:
    a first transistor and a second transistor over a substrate;
    a first anti-fuse element and a second anti-fuse element over the substrate and respectively connected to the first transistor and the second transistor, such that the first anti-fuse element, the first transistor, the second transistor, and the second anti-fuse element are sequentially arranged in a first direction;
a source/drain via connected to the first transistor and the second transistor;
a first gate via connected to a gate structure of the first anti-fuse element, wherein the first gate via is spaced apart from the source/drain via by a first distance in a second direction perpendicular to the first direction in a top view; and
a second gate via connected to a gate structure of the first transistor, wherein the second gate via is spaced apart from the source/drain via by a second distance in the second direction, and the second distance is greater than the first distance.

12. The memory device of claim 11, wherein the first transistor, the second transistor, the first anti-fuse element, and the second anti-fuse element share a same semiconductor fin.

13. The memory device of claim 11, wherein a third distance between the first gate via and the second gate via in the second direction is greater than the first distance between the first gate via and the source/drain via in the second direction.

14. The memory device of claim 11, wherein the second gate via is between the first gate via and the source/drain via in the first direction.

15. The memory device of claim 11, wherein a bottom surface of the first gate via is lower than a top surface of the gate structure of the first anti-fuse element.

16. A memory device comprising:
a transistor comprising first and second fins and a first gate structure crossing the first and second fins, wherein the first and second fins are spaced apart from each other by a first distance;
an anti-fuse element comprising the first and second fins and a second gate structure crossing the first and second fins;
a first gate via connected to the first gate structure of the transistor and spaced apart from the first fin by a second distance greater than the first distance of the first and second fins; and
a second gate via connected to the second gate structure of the anti-fuse element and between the first and second fins.

17. The memory device of claim 16, wherein the first gate via and the second gate via are on opposite sides of the first fin.

18. The memory device of claim 16, wherein the second fin is closer to the second gate via than the second fin is to the first gate via.

19. The memory device of claim 16, wherein a portion of the second gate via is embedded in the second gate structure.

20. The memory device of claim 16, wherein a portion of the first gate via is embedded in the first gate structure.

* * * * *